United States Patent [19]

Aoki et al.

[11] Patent Number: 4,636,985
[45] Date of Patent: Jan. 13, 1987

[54] SEMICONDUCTOR MEMORY HAVING CHARGE TRANSFER DEVICE VOLTAGE AMPLIFIER

[75] Inventors: Masakazu Aoki, Tokorozawa; Yoshinobu Nakagome, Hachioji; Masahi Horiguchi, Kokubunji; Toshifumi Ozaki, Hachioji; Katsuhiro Shimohigashi, Ohminami-Musashimurayama; Shinichi Ikenaga, Kokubunji, all of Japan

[73] Assignee: Hitachi, Ltd., Tokyo, Japan

[21] Appl. No.: 648,361

[22] Filed: Sep. 7, 1984

[30] Foreign Application Priority Data

Sep. 7, 1983 [JP] Japan .................. 58-163215
Sep. 7, 1983 [JP] Japan .................. 58-163216

[51] Int. Cl.⁴ .................................. G11C 7/00
[52] U.S. Cl. ...................... 365/189; 365/204; 365/210
[58] Field of Search ............ 365/189, 204, 207, 210, 365/203

[56] References Cited

U.S. PATENT DOCUMENTS 4,363,111 12/1982 Heightley et al. .......... 365/210

Primary Examiner—Joseph A. Popek
Attorney, Agent, or Firm—Antonelli, Terry & Wands

[57] ABSTRACT

In a semiconductor memory in which a large number of memory cells are arrayed in the shape of a matrix, arrangements are provided for a high-sensitivity read-out. In one embodiment, a writing circuit, a voltage amplifier and a sense amplifier are successively connected to a data line that connects input and output ends of the memory cells in an identical row, with the voltage amplifier being formed as a CTD voltage amplifier that is composed of two charge transfer gates and a driving gate located between them. In accordance with another embodiment, a charge supplying circuit and a charge transfer circuit can be coupled between the memory cells and the sense amplifier to allow information transfer without any substantial loss.

33 Claims, 63 Drawing Figures

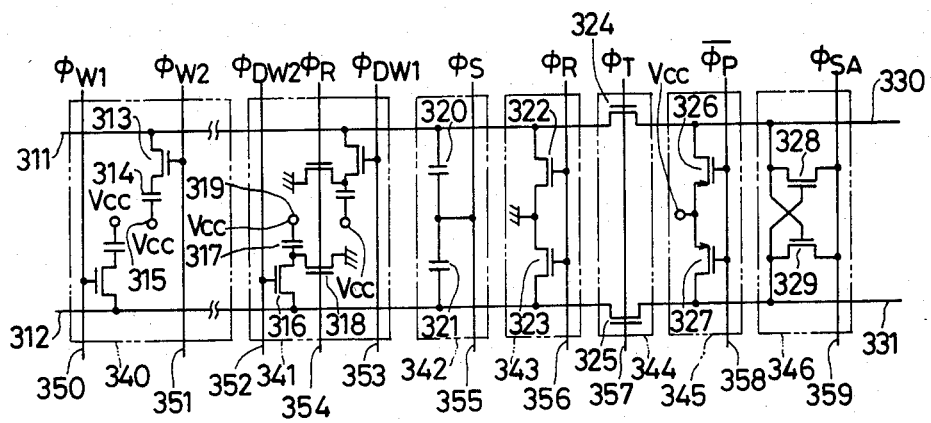
FIG. 15
FIG. 16A  $\phi_R$
FIG. 16B  $\phi_T$
FIG. 16C  $\overline{\phi}_P$
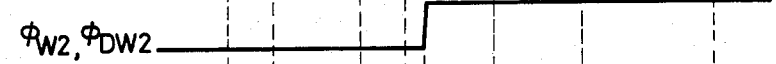
FIG. 16D  $\phi_{W2}, \phi_{DW2}$
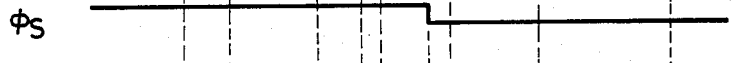
FIG. 16E  $\phi_S$
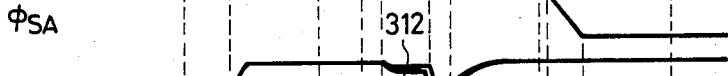
FIG. 16F  $\phi_{SA}$
FIG. 16G  DATA LINE 311, 312
FIG. 16H  330, 331

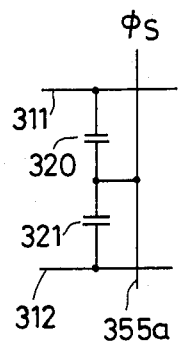
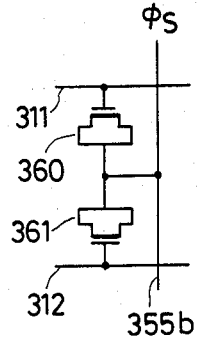
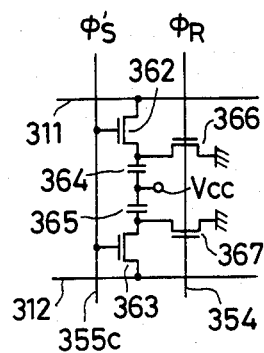
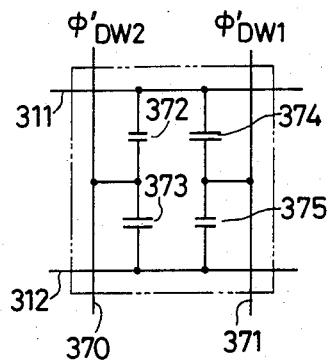
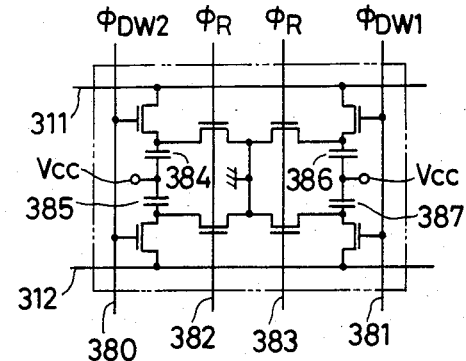
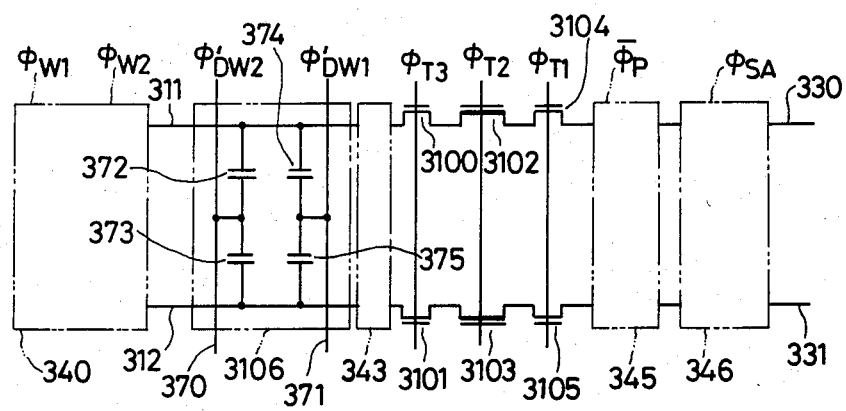

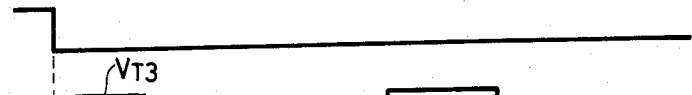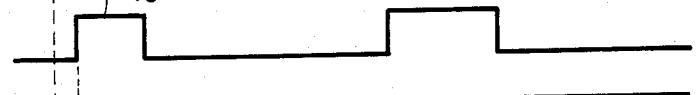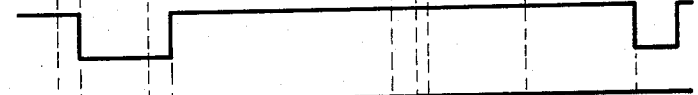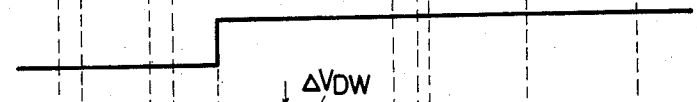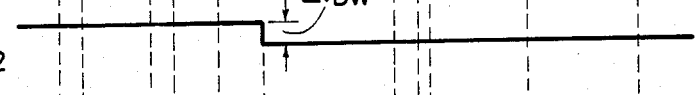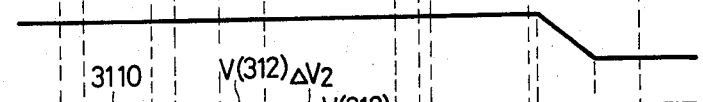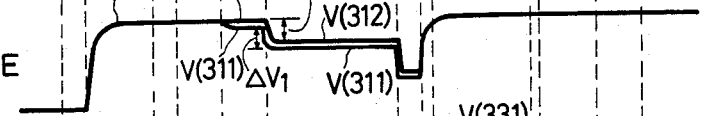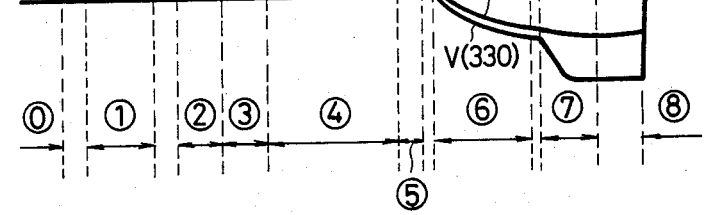

FIG. 21B INTERVAL ① 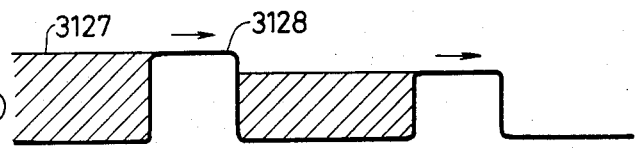
FIG. 21C INTERVAL ② 
FIG. 21D INTERVAL ④ 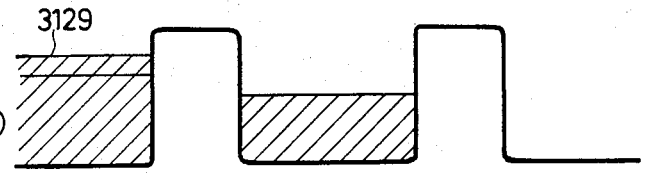
FIG. 21E INTERVAL ⑤ 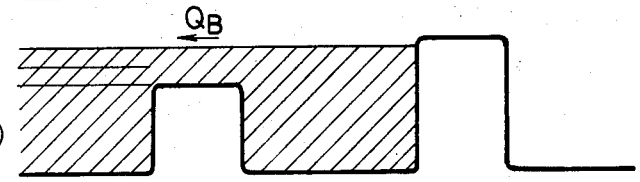
FIG. 21F INTERVAL ⑥ 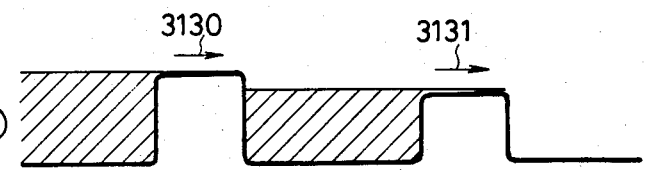

SEMICONDUCTOR MEMORY HAVING CHARGE TRANSFER DEVICE VOLTAGE AMPLIFIER

BACKGROUND OF THE INVENTION

The present invention relates to the so-called RAM (Random Access Memory) which has a large number of memory cells for storing charge carriers in a semiconductor as information sources and which has means for reading out the information stored in the cells and writing the information into the cells in accordance with appointed address signals, and more particularly to a very high density RAM which includes voltage amplifiers of very high sensitivity.

The prior-art structure of the so-called one-transistor type dynamic RAM (1 Tr—dRAM), which has been well known as a RAM employing charge carriers in a semiconductor as information sources and which uses one transistor and one capacitor as the constitutents of a memory cell, is shown in FIG. 1.

Referring to FIG. 1, numeral 1 designates a capacitor which stores signal charge carriers to serve as an information source, numeral 2 a MOS transistor (MOST) which functions as a word gate transistor, numeral 3 a word line which turns "on" or "off" the switch 2 in accordance with addressing in an X direction, and numerals 4 and 5 data lines which transmit the charge carriers. Numeral 6 collectively indicates an address decoder for the addressing in the X direction, and a word driver for driving the word lines 3 (hereinbelow, simply termed "X decoder"). Numeral 7 indicates an address decoder in a Y direction for selecting the data lines, and an input/output circuit (hereinbelow, simply termed "Y decoder" and "I/O circuit" respectively). Numeral 8 denotes a sense amplifier, numeral 9 (within a broken line) a dummy capacitor for producing a reference signal, and numeral 10 a dummy word gate MOST. The fact that one terminal of the capacitor 1 or 9 in the figure is indicated by a circle, signifies that it is connected to the highest D.C. voltage $V_{cc}$ of the system by way of example.

In such prior-art dRAM, when concrete examples of numerical values are mentioned, the charge carriers stored in the capacitor 1 of approximately 50 fF (f: femto-, $10^{-15}$) are shifted onto the data line 4 of approximately 2 pF, and the resulting voltage variation is detected. Accordingly, even a signal voltage $v_s$ having been near the highest voltage of the system (for example, 4 V) when stored in the capacitor 1 of the memory cell becomes as small as about 100 mV when detected, in the above exemplified case. For this reason, a highly accurate amplifier is needed with a simple detection method. As illustrated in FIG. 1, therefore, the charge carriers stored in the dummy capacitor 9 (within the broken line) having a capacitance equal to ½ of that of the capacitor 1 by way of example (25 fF in the exemplified case) are taken out on the data line 5, and the information stored in the capacitor 1 is decided by the differential sense amplifier 8.

However, with this approach, a highly accurate sense amplifier is required for each pair of data lines, and the necessary complicated circuitry for this which exhibits a high performance and which needs electric power cannot be employed for a very high density RAM. Even with the method as stated above, therefore, the signal voltage on the data line is limited to approximately 100 mV with a margin in practical use included. Accordingly, the ratio $C_S/C_D$ between the storage capacitance $C_S$ of the memory cell and the capacitance $C_D$ of the data line needs to be set at or above approximately 1/40, and it is difficult to make the storage capacitance $C_S$ much smaller than the above example. This has formed a serious hindrance to enhancement in the packing density of the dRAM.

As a solution to the above problem, a method employing a charge-transfer sense amplifier has been proposed (L. G. Heller et al, Digest of Technical Papers for ISSCC, pp. 112-113, February 1975; ISSCC being short for "International Solid State Circuit Conference").

FIG. 2 is a diagram for explaining this principle. In the figure, parts 1-8 are similar to those in FIG. 1. The point of difference from FIG. 1 is that a MOST 11 is inserted between the sense amplifier 8 and the data line 4.

A voltage $V_R$ is applied to the gate electrode 12 of the MOST 11 so as to set the potential of the data line 4 at $V_R - V_{T11}$ (where $V_{T11}$ denotes the threshold voltage of the MOST 11). When the charge carriers have been read out from the capacitor 1 of the memory cell, the potential of the data line changes by $\Delta V_D$ (100 mV in the foregoing example), and the MOST 11 falls into the "on" state to the extent of $\Delta V_D$ (that is, $V_{GS11} - V_{T11} = \Delta V_D$ where $V_{GS11}$ denotes the voltage between the gate and source of the MOST 11). When the voltage of the input part 13 of the sense amplifier 8 is set to be sufficiently high (in actuality, a reset transistor is provided), the data line is charged until its potential returns to $V_R - V_{T11}(V_{GS11} - V_{T11} = 0 \quad V)$. $\Delta V_D \approx (C_S/C_D)v_S$ and $\Delta V_I \approx (C_D/C_I)\Delta V_D$ hold (when $v_S$ denotes the signal voltage having been stored in the capacitor 1 and $Q_S$ the quantity of signal charges, $Q_S = C_S \cdot V_S$ holds, and in the above, $\Delta V_I$: the voltage variation of the input part of the sense amplifier, and $C_I$: the capacitance of the input part). Therefore, $\Delta V_I \approx (C_S/C_I)v_S$ holds. Since the value $C_I$ is readily made approximately equal to the capacitance $C_S$ of the memory cell, a voltage on the order of 1 V is claimed to appear at the input part of the sense amplifier. It has been actually impossible, however, to put this measure into practical use. The reason is that, when the gate-source voltage $V_{GS11}$ of the MOST 11 is near the threshold voltage thereof, the MOST 11 is in the mode of operation of tailing current, the value of which is very small, so an almost infinite time is required for the charging of the capacitance $C_D$ as compared with the operating speed of the RAM (refer to "Nikkei Electronics", dated Feb. 19, 1979, pp. 152-153).

In order to overcome the disadvantage of the charge-transfer sense amplifier as described above, methods which derive a signal from a vertical signal output line by the use of bias charges have been proposed in solid-state imaging devices (Japanese Laid-open Patent Application No. 51-107025, Japanese Laid-open Patent Application No. 55-44788). Since, however, they concern the imaging devices, they are essentially different from the case of the RAM in such points that the writing function need not be considered and that conversely circuitry for anti-blooming and/or anti-smearing is required. Moreover, the above proposals have the serious drawbacks of the structure (Japanese Laid-open Patent Application No. 51-107025) and the driving method (Japanese Laid-open Patent Application No. 55-44788) in which the signal charges are read out in a non-saturation mode thereby to sense current. Therefore, their effects in practical use are very low as will be stated later.

Further, a solid-state imaging device in which a charge transfer device is disposed as a horizontal read-out circuit has been proposed (Japanese Laid-open Utility Model Registration Application No. 54-5100). Although this system is excellent for the solid-state imaging device, signals are read out serially due to the use of the charge transfer device, and the dynamic RAM which needs to refresh signals becomes very complicated in structure and is difficult for use.

SUMMARY OF THE INVENTION

An object of the present invention is to provide very high-sensitivity means for reading out, which is suitable for a semiconductor memory of very high integration density.

Another object of the present invention is to realize a high sensivity reading-out circuit having a novel voltage amplifier free from the problems described above, and to provide a very high density RAM of high practability, along with a writing circuit suited for employing the reading-out circuit.

In order to accomplish these objects, according to one aspect of the present invention, writing circuits, voltage amplifiers and a sense amplifier are successively disposed in connection with data lines, and the voltage amplifier is put into a structure composed of a reset gate and a charge transfer gate which are connected to the data line, a charge driving gate, and a charge transfer gate and a precharge gate which are connected to the input end of the sense amplifier. Thus, signal sensing in which noise attributed to the variation between the data lines is small, and even slight signal charge carriers are efficiently transferred to the sense amplifier so as to amplify and decide the signal precisely at a high S/N (signal-to-noise) ratio. Also, writing at high speed becomes possible, and a very high density RAM having very small storage capacitors is realized.

In accordance with another aspect of the present invention, the data line read-out means for stored information can be provided with means for charge transferring, a precharge gate transistor and an information sense amplifier, which are disposed in the recited order, and a means for charge supplying connected with the data line. As a result, a signal charge to be inputted to the data line can be transferred to an input node of the information sense amplifier without any substantial loss so that an output signal voltage of 1/10 to 1/20 as high as the signal voltage of the data line of the prior art can be read out with the same accuracy and at a high speed.

BRIEF DESCRIPTION OF THE DRAWINGS

FIGS. 15 and 16A to 16H are a circuit diagram and its operation timing chart showing one embodiment of the reading-out means which is equipped with the charge supply means according to the present invention;

FIGS. 17A to 17C and 18A to 18B are circuit diagrams showing the constructions of the charge supply means;

FIGS. 19 and 20A to 20J are a circuit diagram and its operation timing chart showing another embodiment which is equipped with another charge transfer means;

FIGS. 21A to 21F are a circuit diagram and a potential chart showing the operation principles of the charge transfer means;

DESCRIPTION OF THE PREFERRED EMBODIMENTS

Now, the present invention will be described in conjunction with embodiments. While, in the following embodiments, a case will be explained where information is stored using electrons as signal charge carriers to carry the information, the invention is quite similarly applicable to a case of using holes by reversing the polarities of supply voltages and pulses and the conductivity types of semiconductors.

Figure 3:
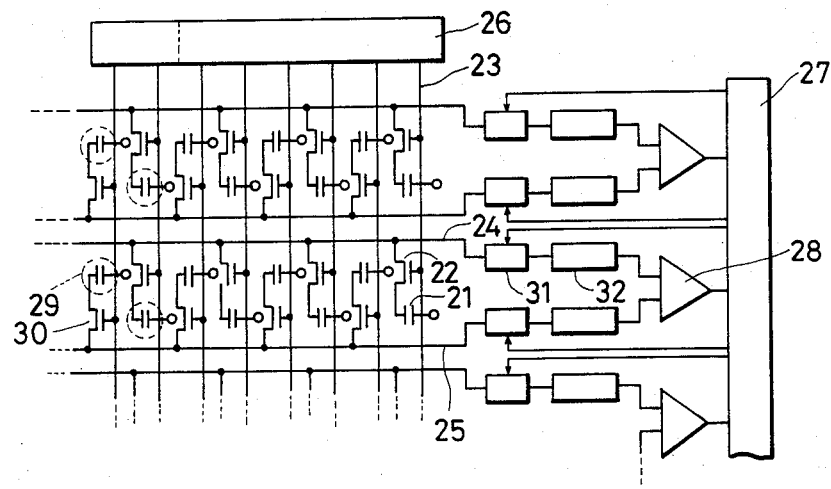
FIG. 3 is a circuit block diagram showing an embodiment of the present invention.
Figure 4:
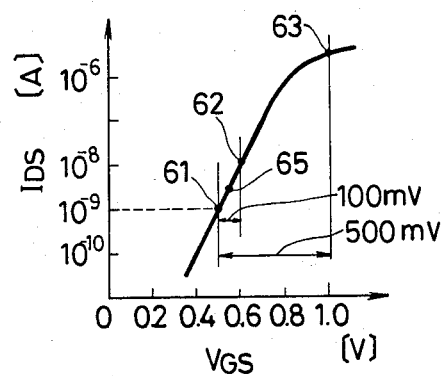
FIG. 4 is a diagram showing the tailing characteristic of a MOST.
Figure 5A:
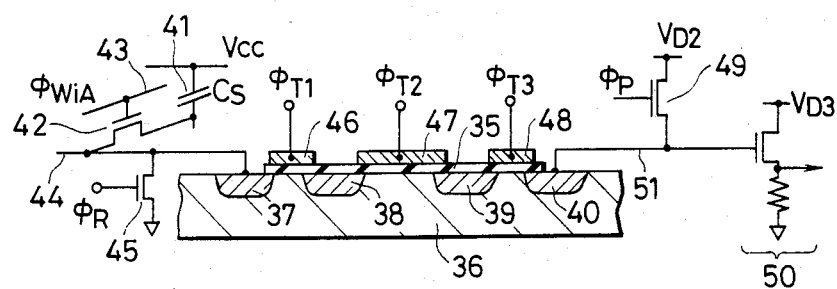
FIGS. 5A–5F are diagrams for explaining the operation of a voltage amplifier in the embodiment of the present invention.
Figure 5B:
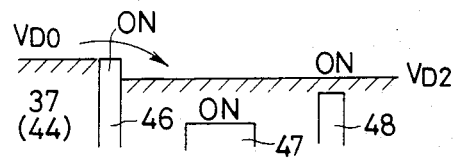
Figure 5C:
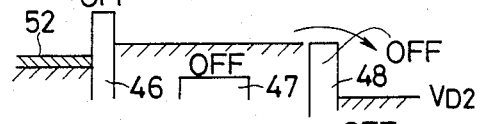
Figure 5D:
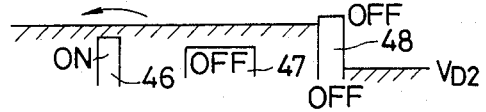
Figure 5E:
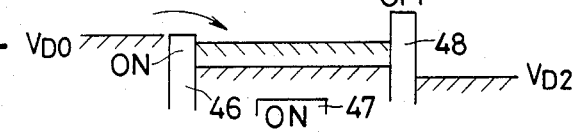
Figure 5F:
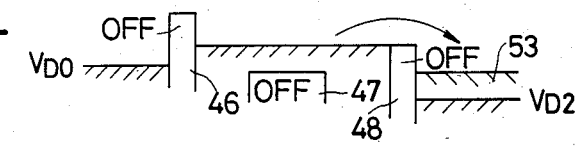
Figure 6:
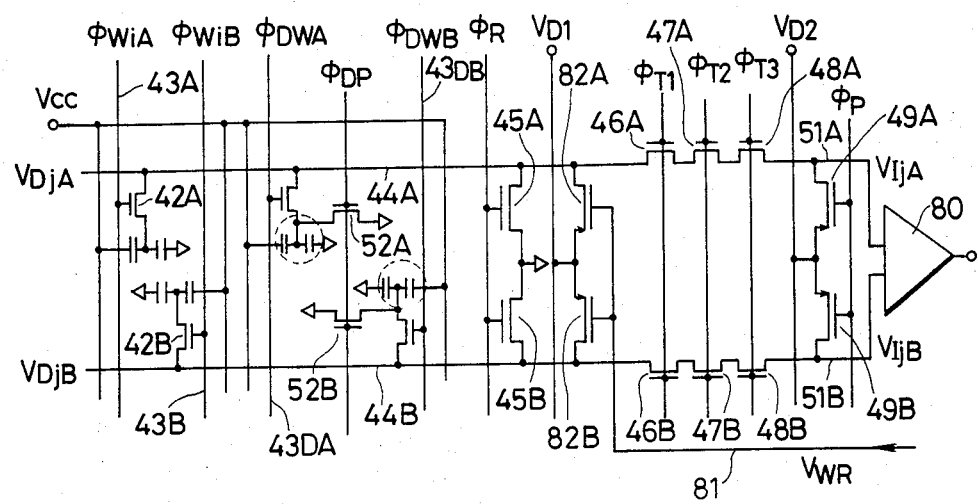
FIG. 6 is a partial circuit diagram showing an embodiment of the present invention.
Figure 7:
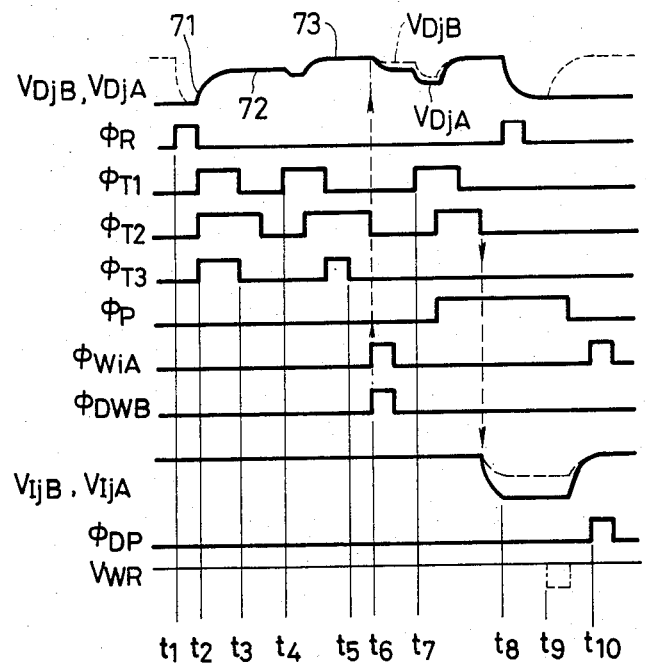
FIG. 7 is a diagram showing the pulse timing chart of the circuit in FIG. 6.

FIG. 3 is a block diagram of the arrangement of one embodiment according to the present invention; FIG. 4 is a diagram showing the tailing characteristic of a MOST as the relationship between the source-drain current $I_{DS}$ and the gate voltage $V_{GS}$ thereof; FIG. 5A is a schematic view of the embodiment with a voltage amplifier centered, while FIGS. 5B, 5C, 5D, 5E and 5F are potential diagrams corresponding to various parts of the section of the voltage amplifier in FIG. 5A for elucidating the operating principle of the voltage amplifier; FIG. 6 is a typical circuit diagram of the embodiment; and FIG. 7 is a driving pulse timing chart and internal waveform diagram corresponding to FIG. 6.

In FIG. 3, numeral 21 designates the storage capacitor of a memory cell, numeral 22 a word gate MOST, numeral 23 a word line, numerals 24 and 25 data lines, numeral 26 an X decoder (including a word driver), numeral 27 a Y decoder and I/O, numeral 28 a sense amplifier, numeral 29 (within a broken line) a dummy capacitor, numeral 30 a dummy word gate MOST, numeral 31 a writing circuit, and numeral 32 a voltage amplifier.

Here, the operating principle of a voltage amplifier 32 will be described with reference to FIG. 4 and FIGS. 5A–5F.

In FIG. 5A, numeral 35 designates an insulator film (of SiO$_2$ or the like), numeral 36 a semiconductor substrate of the p-type conductivity, numerals 37-40 n-type doped regions, numeral 41 the storage capacitance of the memory cell, numeral 42 the word gate MOST, numeral 43 the word line, numeral 44 the data line, numeral 45 a reset gate MOST, numerals 46 and 48 charge transfer gates, numeral 47 a charge driving gate, numeral 49 a precharge gate MOST, and numeral 50 a sense amplifier portion.

First, the reset gate MOST 45 is brought into the "ON" state to reset the data line 44 to 0 V or a sufficiently low voltage. The gate MOST 45 is subsequently brought into the "OFF" state, whereupon the gates 46-48 and 49 are brought into the "ON" states to set the potential of the data line 44 at $V_{D0} = V_{T1H} - V_{ThT1}$ (FIG. 5B). Here, $V_{T1H}$ denotes the high level voltage of a pulse which is impressed on the gate 46, and $V_{ThT1}$ the threshold voltage of the gate 46 (with a back gate bias effect included). The gates 46-48 are subsequently brought into the "OFF" states to set the amount of bias charges to be stored under the driving gate 47 (FIG. 5C). At this time, the signal charge carriers of the storage capacitance 41 are read out onto the data line through the word gate MOST 42 (52 in FIG. 5C). Next, the charge transfer gate 46 is brought into the "ON" state to shift the bias charges under the driving gate 47 to the side of the data line 44 (FIG. 5D). The capacitance of the data line 44 is considerably great among node capacitances in the RAM and often becomes the order of pF, but the capacitance of the driving gate 47 is much smaller than it, so that most of the bias charges shift to the side of the data line. At this time, the bias charges mix with the signal charges. The driving gate 47 is subsequently brought into the "ON" state to feed both the mixed charges under the driving gate 47 (FIG. 5E). Further, the transfer gate 46 and the driving gate 47 are turned "OFF" to transfer the charges to the input end side 51 of the sense amplifier (FIG. 5F). Since, at this time, the pulse voltages applied to the gates 46-48 are in the same condition as in FIG. 5C, only the signal charges are transferred as indicated at numeral 53 with the bias charges untransferred.

Here, the very small amount of signal charges $Q_S$ on the great capacitance $C_D$ of the data line can be efficiently shifted to the small capacitance $C_1$ (the capacitance of the driving gate 47) for the following reason:

Concrete examples of numerical values shall be used, and $C_S = 0.05$ pF, $C_D = 2$ pF, $C_1 = 0.2$ pF, $C_I = 0.1$ pF (the capacitance of the input end of the sense amplifier), $Q_S = 0.2$ pC and $Q_1 = 0.8$ pC (the amount of bias charges) are assumed. The signal voltage having been, e.g., 4 V in the storage capacitance becomes 100 mV on the data line, and the voltage (variation) on the data line at the mixing with the bias charges is 500 mV.

The (cutoff) state in which the gate 46 has stopped current from flowing (the state in which the potential of the data line is rendered $V_{T1H} - V_{ThT1}$ in FIG. 5B) is not a state in which absolutely no current flows, but rather is a state in which the gate 46 falls in the tailing region as illustrated in FIG. 4. A current value in the almost cut-off state with the aforementioned examples of numerical values is on the order of $10^{-9}$ A.

Figure 2:
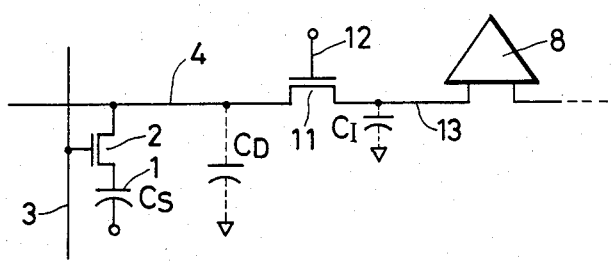

Assuming now that the signal of 100 mV has arrived when the gate is in the state (cutoff state) of a point 61 ($10^{-9}$ A) on a characteristic curve shown in FIG. 4, the operating point of the gate shifts to a point 62 and tends to return toward the point 61 again. Since, however, the current level is low, the voltage is recovered by only at most about 50% (point 65) even after, for example, 10 μs. Since the current value decreases exponentially with lowering in the voltage $V_{GS}$, it takes a very long time for the operating point to approach the original point 61 (for sufficient charges to be transferred), and the inferior shift efficiency spoils practical use. This is the operation of the prior-art example in FIG. 2 as has been found by a detailed experimental study. In the embodiment of the present invention as illustrated in FIGS. 5A-5F, the variation totaling 500 mV is given onto the data line by injecting the bias charges. Then, an operating current which is above three orders greater is attained as indicated at numeral 63 in FIG. 4, and the operating point returns to the point 65 in a very short time. The operating point on this occasion is not very different from that in the absence of the bias charges, but the transferred charges become at least 90%. This signifies that both the signal charges and the bias charges are at least 90%. Therefore, most of the signal charges are shifted under the driving gate 47, and the signal voltage becomes an amplitude of at least 0.9 V. The transfer from under the gate 47 to the sense amplifier input end 51 can be efficiently performed in a short time even in a saturation mode of operation because the amplitude has already become sufficiently large. Thus, a signal voltage of 1.5 V or above appears at the sense amplifier input end.

In this manner, the signal charges are refreshed as a very great voltage. Therefore, insofar as the sense amplifier is of the voltage sensing type, it may well be a simple one such as a source follower shown at numeral 50 in FIG. 5A or an inverter, and the differential amplifier as shown in FIG. 3 is not indispensable in some whole arrangements. In this case, the dummy cells become unnecessary.

To be especially noted here is that the transfer of most of the signal charges does not signify the amplification of the quantity of signal charges, but rather signifies the amplification of the (minute) signal voltage on the data line. That is, the voltage refresh portion in the present invention is the charge transfer type voltage amplifier (hereinbelow, termed "CTD voltage amplifier"). Accordingly, the sense amplifier ought to sense a voltage, and if it senses current, the valuable voltage amplification will become useless. From this viewpoint, it is very important that the transfer from under the gate 47 to the sense amplifier 51 through the gate 48 is performed with the gate 48 set in the saturation mode as illustrated in FIG. 5F, thereby to shift most of the signal charges. When the signal charges are shared (by $C_1$ and $C_I$) in a non-saturation mode of operation, the effect becomes very low. (In the above example, the signal voltage becomes 0.3 V with the transfer in the non-saturation mode and 1.5 V with the transfer in the saturation mode, and there is a difference of 1:5).

As understood from the above description, the charge transfer method employed in the present invention consists in correcting a deviation from an ideal switch attributed to the tailing current characteristic of the MOST. The tailing current characteristic of the MOST illustrated in FIG. 4 is better as its slope is steeper, but the slope is limited to approximately 60 mV/decay at normal temperatures. Accordingly, in order to afford the bias charges which bring forth the current increase of or above two orders as in the foregoing, $C_1/C_D \geq 1/40$ needs to be held when the pulse amplitude $V_{\phi T2}$ to be impressed on the driving gate is assumed to be approximately 5 V in the peak-peak value, so that the capacitance $C_1$ cannot be limitlessly reduced in comparison with the capacitance $C_O$ in the transfer characteristic. On the other hand, the capacitance $C_I$ of the sense amplifier input end should desirably be reduced for raising the voltage gain. After all, therefore, it is appropriate to hold $C_D > C_1 \geq C_I$ in a practical device. When other parasitic effects (a feedback effect attributed to the n+ diffused layer, etc.) are taken into account, it is actual to set $C_1/C_D$ at 1/20 or above and $C_I/C_1$ at ¼ to 1.

FIG. 6 is a practicable circuit model diagram of one embodiment of the present invention shown in FIG. 3, while FIG. 7 is a driving pulse timing chart and internal waveform diagram corresponding to FIG. 6.

In FIGS. 6 and 7, $V_{DjA}$ and $A_{DjB}$ indicate the voltages of data lines, and $V_{IjA}$ and $V_{IjB}$ the voltages of sense amplifier input terminals. MOSTs 82A, 82B, 49A and 49B with arrows on their source sides are of the P-channel type, and they fall into the conductive states ("ON") with lower gate voltages ("low"). At a time $t=t_1$, a reset gate pulse $\phi_R$ is rendered a high level ("high") to reset the data lines 44A and 44B to 0 V as indicated at numeral 71. Subsequently, when pulses $\phi_{T1}-\phi_{T3}$ are rendered "high", nodes 51A and 51B serve as drains because they are connected to a voltage source ($V_{D2}$) through the precharge MOSTs 49A and 49B, so that the voltages of the data lines become close to $V_{T1H}-V_{ThT1}$ as indicated at numeral 72 ($t_2-t_3$). Since, at this time, all gates 46A-48A and 46B-48B function as MOS transistors of very long channels, the influences of the variations of the respective gates are superposed. Therefore, not only the operation time constant becomes long, but also a great variation arises between the voltages of the data lines. In order to eliminate this drawback, before a signal is read out, "vacant reading-out" is once performed to equalize the data line voltages to $V_{T1H}-V_{ThT1}$ (73; operation during $t_4-t_5$). When the vacant reading-out is performed, only the gates 46A and 46B function as switches, so that the data line voltages can be converged to voltages of small variation with a small time constant owing to a great conductance.

Next, word lines 43A and 43DB are rendered "high" ($t=t_6$) to shift the signal charges of a memory cell onto the data line 44A and the charges of a dummy cell to the data line 44B. They are shifted to the sense amplifier input terminals by the foregoing reading-out method ($t_7-t_8$), and are compared and decided by a differential amplifier 80. The decision is transmitted to the writing gate MOSTs 82A and 82B connected to a voltage source $V_{D1}$, by a writing line 81 ($t_9$), and the word line 43A is rendered "high" to be refreshed. At this time, a pulse $\phi_{DP}$ is simultaneously rendered "high" to recharge the dummy cell through MOSTs 52A and 52B ($t=t_{10}$).

Figure 1:
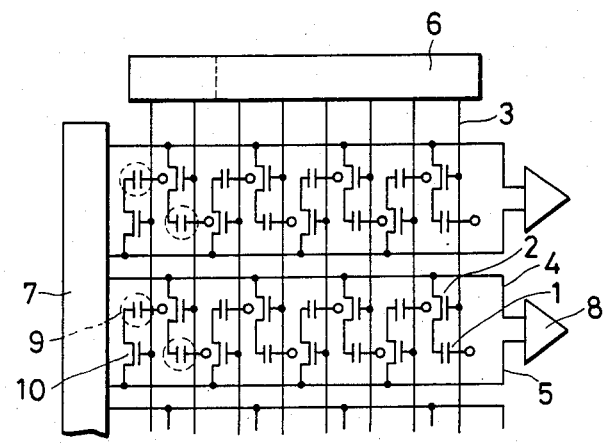
FIGS. 1 and 2 are circuit diagrams each showing the arrangement of a prior-art RAM.

An important feature in the embodiment is the operation wherein the data lines are quickly reset by reset gates 45A and 45B each of which has one terminal connected to a source voltage (0 V in this example) lower than $V_{T1H}-V_{ThT1}$, whereupon the data lines are precisely equalized (set) to $V_{T1H}-V_{ThT1}$ in a short time by the "vacant reading-out". Thus, the initial voltage can be set with the small variation between the data lines and quickly. If the data lines are reset through the voltage amplifier, the initialization is liable to become a very unsatisfactory voltage setting which is low in speed and which is susceptible to the variation of conductances, because the voltage amplifier often becomes low in the current handling capability and the mutual conductance as an ordinary transistor in view of its original purpose. It is also important for writing speed that the writing gates are directly connected to the data lines for the same reason. In this case, the disposition of the writing gates between a memory cell array and the voltage amplifier can establish a structure most suited to facilitate the so-called refresh in which the information decided by the sense amplifier is returned to the writing portion and is rewritten. The difference between the arrangements of the prior-art example in FIG. 1 and the RAM according to the present invention in FIG. 3 is the essential distinction based on the above.

Figure 8:
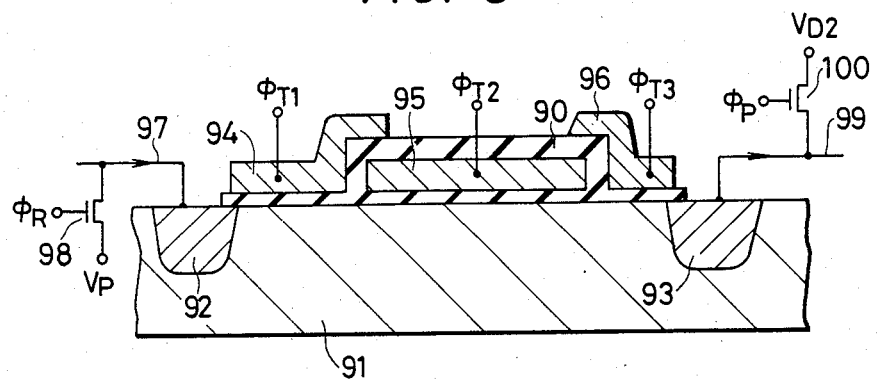
FIGS. 8, 9, 12, 13 and 14 are sectional views each showing an embodiment of the charge transfer portion of a CTD amplifier in the present invention.

FIG. 8 is a diagram which shows another embodiment of the CTD voltage amplifier in the RAM according to the present invention. In the figure, numeral 90 designates an insulator film (of $SiO_2$ or the like), numeral 91 a p-type substrate, numerals 92 and 93 n-type regions, numerals 94 and 96 charge transfer gates, numeral 95 a charge driving gate, numeral 97 a data line, numeral 98 a reset gate MOST, numeral 99 a sense amplifier input end, and numeral 100 a precharge gate MOST at the input end.

With the structure of the CTD voltage amplifier as shown in FIG. 8 wherein the n-type regions to serve as a source and a drain are not located between the gates (a structure similar to that of the so-called charge coupled device or bulk charge transfer device), the transfer loss attributed to the so-called feedback effect can be reduced when charges are transferred from the driving gate 95 to the sense amplifier input end 99, and the transfer efficiency can be enhanced still more.

Figure 9:
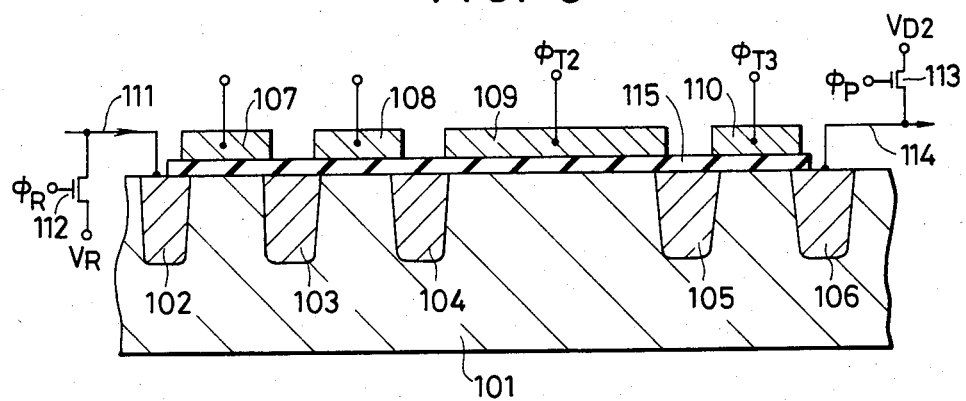

FIG. 9 is a diagram which shows another embodiment of the CTD voltage amplifier in the RAM according to the present invention. In the figure, numeral 101 designates a p-type substrate, numerals 102-106 n-type regions, numerals 107, 108 and 110 charge transfer gates, numeral 109 a charge driving gate, numeral 111 a data line, numeral 112 a reset gate MOST, numeral 113 a precharge gate MOST, numeral 114 a sense amplifier input end, and numeral 115 an insulator film (of $SiO_2$ or the like).

In the structure of FIG. 9, the two charge transfer gates 107 and 108 are comprised on the side of the data line 111. When a D.C. bias is applied to the gate 108 and a transfer pulse to the gate 107, the potential fluctuations of a channel under the driving gate 109 and the n-type region 104 are shielded by the gate 108, so that the transfer loss attributed to the feedback effect can be suppressed during the transfer from the data line 111 to (under) the driving gate 109.

In addition, when a D.C. bias is applied to the gate 107 and a transfer pulse to the gate 108 in the structure of FIG. 9, the potential variation of the data line due to a level voltage variation (often occurring in pulses) during the high level of the transfer pulse can be avoided, and noise due to the fluctuation of a pulse height can be suppressed.

Although, in the structure of FIG. 5A, FIG. 8 or FIG. 9, the substrate has been one of the single conductivity type for the sake of brevity, it is of course allowed to be the so-called CMOS structure which has an n-type body under a p-type substrate.

Figure 10:
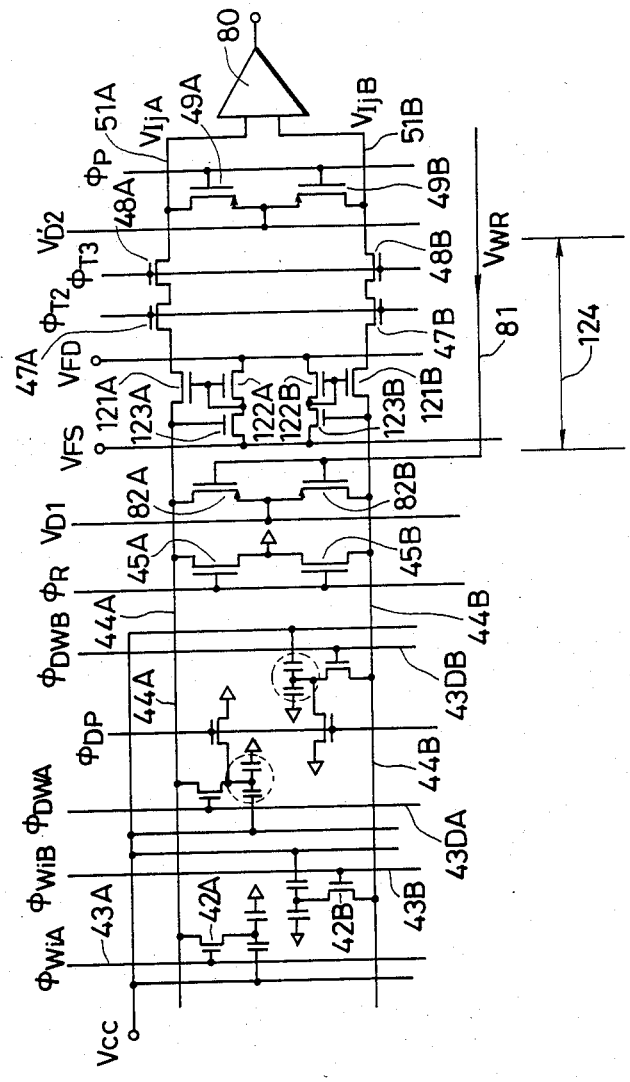
FIG. 10 is a partial circuit diagram showing another embodiment of the present invention.

FIG. 10 is a diagram which shows another embodiment of the CTD voltage amplifier in the RAM according to the present invention. Excepting the voltage amplifier indicated by numeral 124 in the figure, the embodiment is similar to the arrangement of FIG. 6. In the voltage amplifier shown in FIG. 10, a charge transfer gate 121A (121B) on the data line side is supplied with a feedback voltage by depletion-mode MOSTs 122A (122B) and 123A (123B), not with a charge transfer pulse. An inverter composed of the MOSTs 122A (122B) and 123A (123B) detects the voltage of the data line 44A (44B) and feeds it back to the gate 121A (121B). Thus, letting G denote the gain of the inverter, the tailing current coefficient $\alpha$ (mV/decay) of the gate 121A (121B) equivalently becomes about $\alpha/G$, and the slope of the tailing characteristic illustrated in FIG. 4 becomes very abrupt. In consequence, the capacitance $C_D$ of the data line 44A (44B) seems to be about $C_D/G$ in the transfer characteristic, and the transfer characteristic is sharply improved. Since the gain G of the inverter is readily made approximately 40 times, $C_1/C_D$ stated before is permitted to be set at a very small value (1/100 or less). Here, the depletion-mode MOST 122A (122B) functions as a load and is equivalent to a resistor. Symbols $V_{FD}$ and $V_{FS}$ denote the source voltages of the feedback inverter, and the former is a high level voltage, while the latter is a low level voltage.

Figure 11:
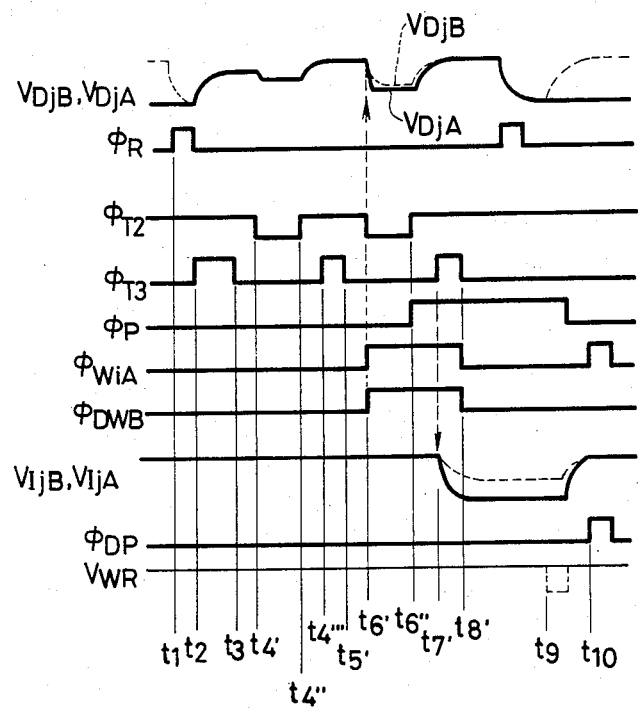
FIG. 11 is a diagram showing the pulse timing chart of the circuit in FIG. 10.

FIG. 11 exemplifies a driving pulse timing chart and internal waveform diagram of the embodiment shown in FIG. 10. Since no pulse is impressed on the charge transfer gate 121A (121B) on the data line side, the initial setting of bias charges is performed with pulses $\phi_{T2}$ and $\phi_{T3}$ being in the "ON" states ($t_2-t_3$, $t_4'''-t_5'$ and $t_7'-t_8'$ in the figure). In addition, the movement of the bias charges to the data line is performed by bringing the pulse $\phi_{T2}$ into the "OFF" state ($t_4'-t_4''$ and $t_6'-t_6''$ in the figure). In this case, the precharge voltage $V_{D2}'$ of the sense amplifier input end is rendered higher than the channel potential of the charge transfer gate 48A (48B) in the "ON" state ($V_{T3H}-V_{ThT3}$; where $V_{T3H}$ denotes the high level voltage of the pulse $\phi_{T3}$, and $V_{ThT3}$ the threshold voltage of the gate) so as to operate this gate in the saturation mode.

In FIG. 11, $t_2-t_3$ corresponds to the "rough adjustment" of the voltage of the data line, $t_4'-t_5'$ the "precise adjustment" of the data line voltage by the vacant reading-out, and $t_6'-t_8'$ the reading-out of data. The others are the same as in FIG. 7.

The embodiments of the present invention described above may well be used in combination. The effect of the present invention can also be more enhanced using various modifications, for example, one in which a gate MOST is disposed at the sense amplifier input end to isolate it from the charge transfer portion, thereby to prevent coupling noise attributed to any unnecessary pulse.

In the description of the embodiment in FIG. 5A, the numerical values have been exemplified with which the voltage of 1 V or above appears at the sense amplifier input end. In this case, the sense amplifier becomes simple as stated before, and enhancement in the packing density is achieved in the sense that the peripheral circuit is simplified. On the other hand, in the case where as shown in FIG. 6, the differential sense amplifier is employed to decide information as in the prior art, a memory cell having a storage capacity smaller than in the prior art by one order or above can be employed even when a hitherto-known circuit is used as the sense amplifier, because it suffices that the signal of approximately 100 mV appears at the sense amplifier input end. Thus, the density of a memory cell array portion can be sharply enhanced.

From a similar viewpoint, when the memory cell capacity is rendered substantially equal to that in the prior art and the present invention is applied to the so-called multi-level storage RAM which stores multi-level charge storage states analogously and detects them, a high multi-level RAM can be realized, and a very high density RAM is also obtainable.

Although the CMOS (complementary MOS) circuit has been partly employed in the embodiment of FIG. 6, this is not essential in the present invention, and it is a matter of course that the memory may well be wholly constructed of N- or P-channel MOSTs. In addition, although the present invention has been applied to the dRAM in all the cases in the above description, this is not restrictive, but it is a matter of course that the present invention is applicable to any RAM which stores and reads out information by employing charge carriers in a semiconductor as an information source, for example, a pseudo-static RAM (psRAM).

Although, as the driving method of the semiconductor device according to the present invention, one especially contrived so as to satisfactorily attain the effect of the present invention has been illustrated in FIGS. 5A–5F and FIG. 7, this is not always restrictive, but another method is also possible.

As set forth above, according to the present invention, in a RAM which stores charge carriers within a semiconductor as an information source and reads them out, a CTD voltage amplifier of excellent efficiency is provided along with a writing circuit which is disposed in an arrangement of good efficiency in correspondence therewith, thereby making it possible to sense even a very small amount of signal charges, whereby a RAM in which the storage capacity of an information memory cell is very small and which is much higher in the packing density than the prior art is realized.

Regarding the CTD voltage amplifier described above in detail, the charge transfer portion can be efficiently driven by pulses of equal high levels ("high") and low levels ("low") in such a way that the relationship among the threshold voltage $V_{ThT1}$ of the transfer gate and that $V_{ThT2}$ of the driving gate on the data line side and the threshold voltage $V_{ThT3}$ of the transfer gate on the sense amplifier side is set at $V_{ThT1} > V_{ThT3} > V_{ThT2}$ (for transferring electrons; at $V_{ThT1} < V_{ThT3} < V_{ThT2}$ for transferring holes), and that the driving gate is especially rendered the depletion mode. This will be described in detail below.

Figure 12:
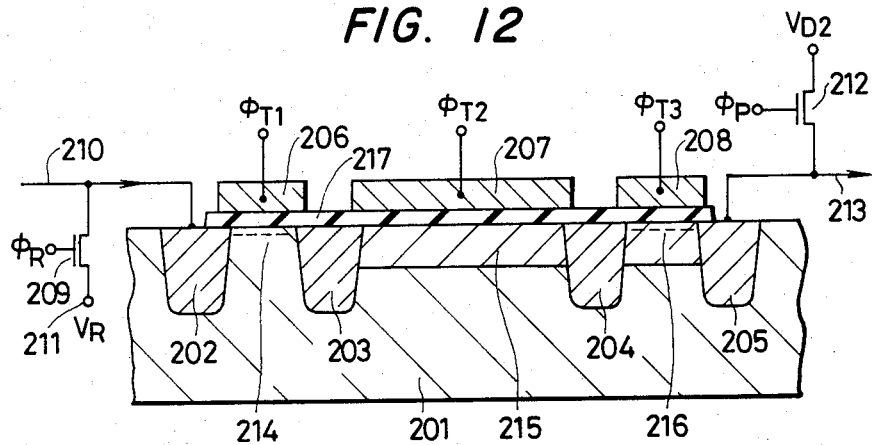

FIG. 12 is a diagram showing one embodiment of the present invention, and illustrates a section of the charge transfer portion of a dRAM having a CTD voltage amplifier. In the figure, numeral 201 indicates a p-type substrate, numerals 202–205 n-type regions, numerals 206 and 208 charge transfer gates, numeral 207 a driving gate, and numerals 214, 215 and 216 the channel portions of the respective gates. The channel portion 214 is formed into the enhancement type (hereinbelow, abbreviated to "E type") by, e.g., the ion implantation of boron ions; the channel portion 215 is formed of the n-type layer and into the deep depletion type (hereinbelow, "DD type") by, e.g., the ion implantation of phosphorus ions; and the channel portion 216 is formed into the depletion type (hereinbelow, "D type") by the double ion implantation of the above two. Numeral 210 designates a data line, numeral 209 a reset gate, numeral 211 a reset voltage applying terminal, numeral 213 a sense amplifier input end, numeral 212 a precharge gate, and numeral 217 an insulator film.

With the charge transfer portion of the structure as shown in FIG. 12, when the threshold voltages of the respective gates 206, 207 and 208 are denoted by $V_{ThT1}$, $V_{ThT2}$ and $V_{ThT3}$, $$V_{ThT1} > V_{ThT3} > V_{ThT2} \tag{1a}$$

holds. Even when the "high" levels and "low" levels of pulses to be impressed on these gates are respectively equalized, channel potentials under the gates can be assimilated to those in FIGS. 5B and 5F, and D.C. offset voltages are dispensed with among the applied pulses $\phi_{T1}$, $\phi_{T2}$ and $\phi_{T3}$. When pulses with the D.C. offset voltages are particularly generated within a chip, it is often the case to increase the number of source voltages or to cause direct currents to flow, so the power consumption increases in vain. In the dRAM whose specifications on the power consumption and the supply voltages are severe, it is especially important that the gates can be driven with the pulses of the equal "high" and "low" levels as stated above, and the effect is great in practical use. In addition, when holes are used as charge carriers, $$V_{ThT1} < V_{ThT3} < V_{ThT2} \tag{1b}$$

holds.

Here, since charges are often existent under the gate 207 (47) as understood from FIGS. 5B–5F, this gate should effectively be of the D type. Especially when it is rendered the DD type as shown in FIG. 12, the charges can be transferred at high efficiency owing to the fringe electric field thereof. This is important particularly for holding the transfer efficiency high when the channel length of the driving gate is increased so as to increase the capacitance thereof in comparison with that of the transfer gate functioning as a switch, to the end of storing a sufficient amount of bias charges.

Figure 13:
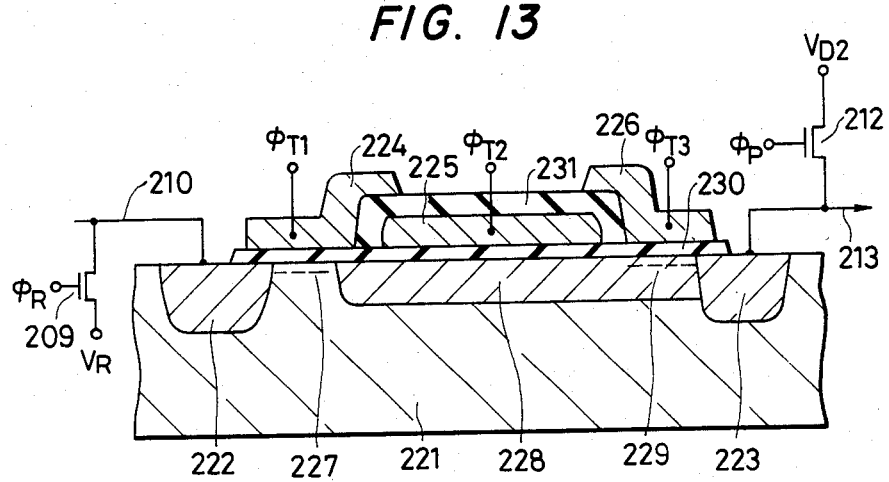

FIG. 13 is a diagram showing another embodiment of the present invention. In the figure, numeral 221 denotes a p-type substrate, numerals 230 and 231 insulator films, numerals 222 and 223 n-type semiconductor layers, numerals 224 and 226 charge transfer gates, numeral 225 a driving gate, and numerals 227, 228 and 229 the channels of the respective gates. The channel 227 is of the E type, the channel 228 is of the DD type, and the channel 229 is of the D type.

When the n-type layers between the gates are removed as illustrated in FIG. 13, parasitic effects attributed to the n-type layers can be avoided. In particular, charges left untransferred on account of the feedback effect can be reduced, and a transfer characteristic in the gate 226 is enhanced.

Figure 14:
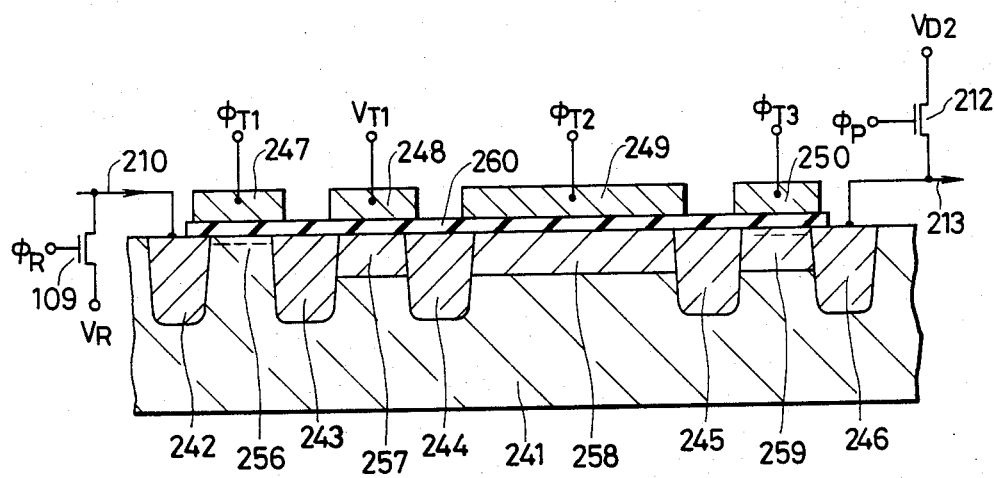

FIG. 14 is a diagram showing another embodiment of the present invention. In the figure, numeral 241 denotes a p-type substrate, numeral 260 an insulator film, numerals 242–246 n-type semiconductor layers, numerals 247, 248 and 250 charge transfer gates, numeral 249 a driving gate, and numerals 256–259 the channels of the respective gates. The channel 256 is of the E type, the channels 257 and 258 are of the DD type, and the channel 259 is of the D type.

Owing to the structure as shown in FIG. 14, when a D.C. bias $V_{T1}$ is kept applied to the gate 248, the feedback effect in the transfer from a data line 210 to under the driving gate 249 is reduced, and the transfer efficiency can be sharply improved. The transfer loss $\epsilon$ of charges left untransferred due to the feedback effect can be approximately expressed by:

$$\epsilon \simeq \alpha \frac{C_D}{C_{T2}} \tag{2}$$

where $C_D$ denotes the capacitance of the data line, $C_{T2}$ the capacitance of the driving gate, and $\alpha$ the drain-source voltage ($V_{DST1}$) dependency of the threshold voltage $V_{ThT1}$ of the charge transfer gate (composite gate at 147 and 148)

$$\left( \alpha \triangleq \left| \frac{\partial V_{ThT1}}{\partial V_{DST1}} \right| \right).$$

The ratio between $C_D$ and $C_{T2}$ is considerably great ($\sim 10$) in this case. Therefore, when $\alpha$ is rendered small by the gate structure as shown in FIG. 14, the transfer efficiency is greatly improved.

When, in FIG. 14, both the channels 256 and 257 are rendered the E type and a D.C. bias ($V_{T1}'$) and a transfer pulse $\phi_{T1}$ are respectively applied to the gates 247 and 248, it is possible to prevent the voltage of the data line from fluctuating due to the jitter of the "high" level of the pulse $\phi_{T1}$, etc. and equivalent noise from mixing.

Here, when conditions mentioned below are added in the performance of the present invention, the effect of the present invention is more ensured. (The conditions within parentheses correspond to the case where holes are the carriers.)

$$V_{ThT1} > V_{ThT2} + \frac{1}{C_{T2}} (Q_{DR} + Q_S) \tag{3a}$$

$$\left( V_{ThT1} < V_{ThT2} - \frac{1}{C_{T2}} (Q_{DR} + Q_S) \right) \tag{3b}$$

$$V_{D2} - \frac{Q_S}{C_I} > V_{\phi L} - V_{ThT3} \tag{4a}$$

$$\left( V_{D2} + \frac{Q_S}{C_I} < V_{\phi H} - V_{ThT3} \right) \tag{4b}$$

$$V_{\phi H} - V_{ThT1} > V_{\phi L} - V_{ThT3} \tag{5a}$$

$$(V_{\phi L} - V_{ThT1} < V_{\phi H} - V_{ThT3}) \tag{5b}$$

Here, $V_{\phi H}$ and $V_{\phi L}$ denote the "high" and "low" level voltages of the pulse respectively, $C_{T2}$ and $C_I$ the capacitances of the driving gate and sense amplifier sides with respect to the node 51 (FIG. 5A) respectively. $Q_{DR}$ and $Q_S$ the quantities of bias charges and signal charges respectively, and $V_{D2}$ a D.C. voltage (precharge voltage) which is applied to the node 51.

The aforementioned conditions will be explained with reference to FIGS. 5B–5F. Equation (3a) or (3b) signifies the state as seen from FIG. 5E, that is, the condition that in transferring the mixed bias charges and signal charges ($Q_{DR}+Q_S$) under the driving gate 47, the transfer gate 46 is operated in the saturation mode so as to bring the predetermined charges ($Q_{DR}+Q_S$) under the driving gate. Likewise, Equation (4a) or (4b) signifies the state as shown in FIG. 5F, that is, the condition that the transfer gate 48 is operated in the saturation mode so as to properly transfer the signal charges $Q_S$ to the node 51 (sense amplifier input side). Equation (5a) or (5b) signifies the states as shown in FIGS. 5D and 5E, that is, the condition that when charges are delivered between the data line 44 and the driving gate 47, the leakage etc. of the charges under the transfer gate 48 are prevented to properly hold the "off" level.

In FIG. 5F, however, the transfer to the sense amplifier input side can also be performed with the gates 47 and 48 held in the "on" states. In this case, the conditions of the equations (4a) and (4b) become as follows:

$$V_{D2} - \frac{Q_S}{C_I} > V_{\phi H} - V_{ThT3} \tag{6a}$$

$$\left( V_{D2} + \frac{Q_S}{C_I} < V_{\phi L} - V_{ThT3} \right) \tag{6b}$$

Although, in the above description, the case of employing electrons as signal charges has been indicated, the present invention is similarly applicable even to a case of employing holes as signal charges, by reversing the conductivity types of semiconductors and the polarities of source voltages and pulses.

As set forth above, according to the present invention, in a high density dRAM having a CTD voltage amplifier, the threshold voltages of gates in a charge transfer portion are set at appropriate conditions, thereby to permit favorable charge transfer with driving pulses whose high level and low level voltages are respectively equal, whereby the offset voltages among the driving pulses become unnecessary, and particularly, the peripheral circuit portion of the dRAM ca be simplified to lower the power consumption, whereby a high density dRAM which is easy to handle in practical use and readily assembled in a system is realized.

A description of embodiments of the invention in conjunction with FIGS. 15 to 25 which concern the use of a charge supply means will now be described. In the following embodiments, the description will be made upon the case in which electrons are used as charge carriers carrying the information and in which an N-channel transistor for electron transferring is used as a charge transfer gate. However, four combinations are conceivable as to the kinds of the charge carriers as the information carriers and the charge carriers to be transferred by the charge transfer gate. In any of these combinations, absolutely the same discussion can be applied by suitably selecting the polarities of a power supply and pulses, the conduction of a semiconductor and the quantity of the charge to be supplied from the charge supplying means.

FIG. 15 shows one embodiment of a charge storage type semiconductor memory (which will be abbreviated as a "DRAM") according to the present invention. For convenience, a P-channel MOS transistor is indicated by an arrow so that it may be discriminated from an N-channel MOS transistor. Incidentally, explanations of means for writing and means for addressing will be omitted for clarity of the explanation. On the other hand, FIG. 15 notes and shows a pair of data lines of a memory array. In FIG. 15, reference numeral 340 indicates a memory array for storing charges carrying information, and numeral 341 indicates a dummy cell for supplying reference charges to the other data line, which forms a pair with a data line connected with a memory cell selected, when the information is to be read out from the memory array. Moreover, reference numerals 342, 343, 344, 345 and 346 indicate means for charge supplying, a reset gate transistor, means for charge transferring, a precharge gate transistor, and an information sense amplifier, respectively. The operations of the present memory device will be described in detail in the following.

One memory cell and one dummy cell are selected by a word line and a dummy word line, which are arranged to intersect a pair of data lines 311 and 312 at a right angle. In this embodiment, a word line 351 and a dummy word line 352 are selected so that a signal charge and a reference charge are supplied to the data lines 311 and 312, respectively, from a memory cell capacitor 314 and a dummy cell capacitor 317. In order to sense the presence of the signal charges, the quantity of the reference charge is selected to be about one half as high as that of the signal charge. For this purpose, the value of the dummy cell capacitor 317 is set at about one half as high as that of the memory cell capacitor 314. The means for supplying charges to the data lines is composed of two capacitors 320 and 321 and a driving line 355. If a voltage amplitude and a capacitance to be given to the driving line are designated at $\Delta V_S$ and $C_{SP}$, respectively, charges of $\Delta V_S \times C_{SP}$ are supplied to the data lines. The charge transferring means is composed of MOS transistors 324 and 325. A flip-flop sense amplifier is used as the information sense amplifier. This sense amplifier is composed of two MOS transistors 328 and 329, one of which has its gate connected with the drain of the other. FIG. 16 shows waveforms of driving pulses (a) to (f) during the reading out operation of that circuit and the waveforms at a data line portion (g) and an output terminal (h) of a charge transferring portion. Prior to the reading-out, the dummy cell capacitor and the data line are reset at the each potential by reset pulses. After that, for a period from a time $t_1$ to a time $t_3$, precharge pulses $\phi_P$ are applied to set such a potential condition as can effect the reading-out. Simultaneously with this, for a period from the time $t_1$ to the time $t_2$, transfer gate pulses $\phi_T$ are applied to set the data line potential at $V_H - V_T$ (wherein $V_T$ designates the gate threshold voltage of the transfer gate transistors 324 and 325, and $V_H$ designates the higher level of the pulses $\phi_T$). By this setting, the charge transfer gate transistors 324 and 325 are caused to wait for operation in the sub-threshold region, i.e., in the region having an exponential relationship between a gate-source voltage and a channel current. In order to accelerate transfer of the signal charges, it is necessary to select a large value for the channel current immediately after the state for waiting for operation has been shifted to the state of signal transferring. For that necessity, for the period of waiting, the pulses $\phi_S$ are applied to discharge the charges (i.e., electrons here) from the charge supplying means to the data lines thereby to enlarge the gate-source voltage of the charge transfer transistors 324 and 325 (for period $t_5-t_6$). Simultaneously with this, for the same period, the signal charges are read out (for the period $t_4-t_5$). After this, the transfer gate pulses $\phi_T$ are applied again to transfer the signal charges (for period $t_6-t_7$). After this, pulses $\phi_{SA}$ are applied to operate the information sense amplifier (for period $t_8-t_9$) to amplify a small signal voltage to such a voltage level as can be handled by a digital logic circuit. In order to accelerate the signal charge transfer, there can be conceived a method by which the width of the pulses $\phi_T$ upon the precharge and upon the transfer is shortened to enlarge an operating current. In case the pulse width is varied by the fluctuations of the supply voltage, however, the set voltage highly fluctuates so that a stable operation cannot be expected. On the other hand, in case the information is sensed a plurality of times, as in the sense circuit of a memory using multiple level storage structure, the acceleration method of the signal charge transfer having been described in the present invention is effective. This is because, according to the present invention, it is sufficient to conduct the setting (i.e., the precharge) of the data line potential only one first time so that the spare time and power due to the charge and discharge of the plural data lines can be eliminated. Thus, in order to accelerate the transfer of the signal charge, it is effective to supply an equal quantity of charge to the individual data lines. This carrier will be called a "carrier charge" in the following for convenience purpose.

One of the arrangements shown in FIG. 17 can be applied as means for supplying the carrier charges to the data lines. In FIG. 17, numerals 311 and 312 indicate the paired data lines, and numeral 355 indicates a driving line of the carrier charge supplying means. The means shown in FIG. 17(a) is the same as that used in FIG. 15. FIG. 17(b) shows an example, in which the capacitors 320 and 321 are composed of the capacitors of the MOS transistors, respectively, e.g., depletion type MOS transistors 360 and 361. FIG. 17(c) shows the charge supplying means which has the same construction as that of the dummy cell and which is composed of capacitors 364 and 365, charge transferring transistors 362 and 363, and capacitors potential resetting transistors 366 and 367. In the carrier charge supplying means of FIGS. 17(a) and (b), a signal voltage to change to a lower voltage is applied to the driving signal lines. In the case of FIG. 17(c), on the contrary, a signal voltage to change to a higher voltage is applied thereto. If the value of the voltage amplitude is designated at $\Delta V_S$ and if the value of the capacitor is designated at $C_{SP}$, the quantity of the carrier charge to be supplied to each data line is generally expressed by $\Delta V_X \times C_{SP}$. In the system of FIG. 17(c), there can be attained an advantage that the capacitance for the carrier charge supplying is not added to that of the data lines so that the signal voltage of the data lines can be enlarged.

By making the carrier charge supplying means act as the dummy cell (i.e., the reference charge supplying cell), moreover, the number of the driving lines can be reduced. This example is shown in FIG. 18. FIG. 18(a) corresponds to the example which is composed of two driving signal lines $\phi_{DW1}'$ and $\phi_{DW2}'$ 370 and 371 and four capacitors 372, 373, 374 and 375 connected between the two data lines. When the memory cell connected with the data line 311 is selected, the driving signal is applied to the driving signal line 370. When the memory cell connected with the data line 312 is selected, on the other hand, the driving signal is applied to the driving signal line 371. If the common value of the capacitors 372 and 375 is designated at $C_{d1}$, if the common value of the capacitors 373 and 374 is designated at $C_{d2}$, and if the amplitude of the driving signal is designated at $\Delta V_{DW}$, the quantity of the reference charge is expressed by $(C_{d2}-C_{d1}) \times \Delta V_{DW}$. The value of this expression of $(C_{d2}-C_{d1}) \times \Delta V_{D2}$ is set at about one half as high as the quantity of the signal charge to flow to the data lines. FIG. 18(b) shows a method by which enlargement of the signal voltage of the data lines can be realized in accordance with the same concept as that of the example shown in FIG. 17(c). The example is composed of two driving signal lines 380 and 381, two reset signal lines 382 and 383, four transfer transistors connected with the driving signal lines 380 and 381, four reset transistors connected with the reset signal lines 382 and 383, and four capacitors for setting the quantity of the carrier charge and the quantity of the reference charge. The principle is not different from that of the example of FIG. 18(a), and the driving signal is applied to the line 380, when the data line to be connected with the memory cell selected is the line 311, and to the line 381 when the same is the line 312. The quantity of the reference charge is substantially expressed by $(C_{d2}-C_{d1}) \times \Delta V_{DW}$ wherein: the common capacitance of capacitors 384 and 387 are designated at $C_{d1}$; the capacitance of capacitors 385 and 386 at $C_{d2}$ ($C_{d2} > C_{d1}$); and the amplitude of the driving signal at $\Delta V_{DW}$.

As has been described in connection with the foregoing embodiment hereinbefore, in case the charge transferring means is composed of one MOS transistor for one data line, the signal charges can be efficiently transferred by providing each data line with the carrier charge supplying means.

Next, another embodiment of the present invention is shown in FIG. 19. In this embodiment, there is used charge transferring means which is composed, for one data line, one charge driving gate and two charge transfer gates. In FIG. 19, reference numerals 340, 3106, 343, 345 and 346 indicate a memory array, carrier charge and reference charge supplying means, a reset gate transistor, a precharge gate transistor and information sense amplifier, respectively. The charge transfer means is composed of driving gate transistors made of depletion of MOSFETs 3102 and 3103, and transfer gate transistors 3100, 3101, 3104 and 3105. The charge supplying means is the same as that shown in FIG. 18(a). Moreover, the portions other than the charge transfer means have constructions not different from those of the previous embodiment. In order to exhibit the effect of the charge supplying means for the signal charge transfer, in the present example, the operations will be described in the following by the use of the driving and operating waveforms shown in FIG. 20.

Figure 21A:
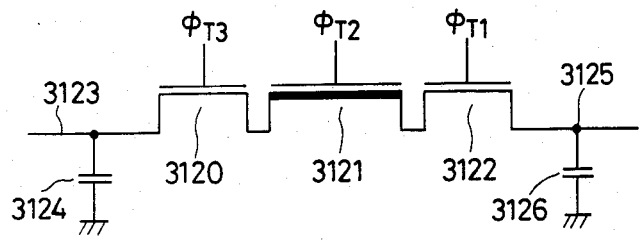

FIGS. 20(a) to (h) show the waveforms of the driving pulses of the individual signal lines, and FIGS. 20(i) and (j) show the operating waveforms of the data lines and the output node of the charge transfer means. For a period ⓪, the reset pulses $\phi_R$ are applied to set the data lines at the earth potential $V_{SS}$. After this, for a period ①, pulses $\phi_{T3}$ and $\phi_{T1}$ are applied to the gates of two transfer gate transistors T3 (3100 and 3101) and T1 (3104 and 3105), and simultaneously with this the precharge pulses $\phi_P$ are applied to precharge the data lines. What is important at this time is the necessity for the control of the threshold voltage of the transfer gate transistors, or the height of the pulses (e.g., the height of the T1 driving pulses $V_{T1}$ > the height of the T3 driving pulses $V_{T3}$) such that the potential barrier beneath the gate T3 may be higher than that beneath the gate T1. In this example, the necessity is satisfied by making a difference of about 0.2 to 0.3 V between the pulse heights of the gate transistors T3 and T1. Here, in this case, the precharge voltage 3110 of the data lines is set at about the voltage of $V_{T3}-V_{TH(T3)}$. Here, the voltage $V_{TH(T3)}$ is the threshold voltage of the transfer gate transistor T3. FIG. 21(b) shows the potentials at the individual portions, e.g., the data lines, the charge transfer gate transistors or the output nodes of the latter. The charges (i.e., the electrons in this case) flow out until a data line potential 3127 becomes equal to the potential 3128 beneath the gate transistors T3. Likewise, FIG. 21(c) shows the potential for a waiting period 2 (which should be referred to FIG. 20. From this state, for a period 3, a high voltage is applied to the word lines so that a signal (e.g., "1"—no change, or "0"—potential drop due to flow-out of electrons) appears on the data lines in a manner to correspond to the information (e.g., "1"=high voltage, or "0"=low voltage) which is written in the memory cell. FIG. 20 shows the data line waveforms (i.e., V(311)) when the signal "0" is read out. Incidentally, since no signal appears on the reference data lines, no potential drop occurs (V(312)). For a period 4, moreover, the charge supply means operates in synchronism with the driving signal $\phi_{DW2}'$ to output the reference charge and the character charge to the data lines. Of the changes in the data line potential, as seen from FIG. 20(i), the change $\Delta V_1$ in the potential V(311) of the data line 311 connected with the selected memory cell is contributed to only by the carrier charge, whereas the change $\Delta V_2$ in the potential V(312) of the data line 312 is contributed to by both the carrier charge and the reference charge (i.e., the dummy charge). As a result, the difference of V(312)−V(311) between the voltages of the data lines for the period 4 is about one half as high as the signal amplitude. For the period 4, as shown in FIG. 21(d), either the carrier charge or the carrier charge and the dummy charge contribute to the rise (at 3129) of the electron potential of the data lines. In order to transfer the signal charges on the data lines, from period 5 to period 6, the pulses are applied to driving gate transistors T2 and the transfer gate transistors T3 and T1. In order to accelerate the charge transfer from the data lines to beneath the driving gate transistors, for period 5, bias charges $Q_1$ are injected from the driving gate transistors to the data lines (as shown in FIG. 21(e)). The quantity of the bias charges is about 100 to 200 fc (femeto-coulombs), for example, for the capacity of the data lines=1 pF. This is intended, as has been touched in the foregoing embodiment, to enlarge the channel current of the transfer gate transistors T3 during the transfer and to accelerate the transfer of the signal charges. By the above bias charges, the channel current is enlarged by one or two orders, and the signal transfer period is shortened by one or two orders. For the period 6, the transfer gate transistors T1 are rendered conductive to simultaneously conduct the charge transfer 3131 from the driving gate transistors T2 to the output node of the charge transfer means. The transfer 3130 beneath the transistors T3 is accelerated by the effect of the bias charges $Q_1$, and the carrier charges are highly effective for the transfer 3131 beneath the gate transistors T1. In other words, the charges $Q_1$ respectively migrate between the driving gate transistors T2 and the data lines, and other charge supply is required for efficient transfer beneath the gate transistors T1. This requirement is met by the carrier charges. Thus, the signal output, which is generated by the signal charges transferred to the output node of the charge transfer means, is amplified by the sense amplifier (for period 7, as shown in FIG. 20(j).

Here, by using a method of overlapping the pulses of the gate transistors T3 and T1, the feedback effect can be reduced so that the capacitance $C_1$ of the driving gate transistors can be made smaller than a data line capacitance $C_D$.

According to the results of experimental analyses, the transfer efficiency of the signal charges from the capacitance $C_D$ to the capacitance $C_1$ is determined in dependence upon what times the operating current is multiplied by the bias charges $Q_1$. For a tail coefficient of $\alpha=60$ mV/decade, for example, charges of about 10% are left if the operating current is increased by one order, i.e., $Q_1/C_D=60$ mV, and signal charges of about 1% are left if the operating current is increased by two orders, i.e., 120 mV. It is now assumed that the pulse amplitude to be applied to the driving gate transistors be 5 $V_{pp}$. In order to leave 1% or less, the ratio of $C_1$ to $C_D$, i.e., $C_1/C_D$ has to be about 1/40 or more. However, in case the flip-flop type sense amplifier thus far described in the present embodiment is used as the sense amplifier, the signal charges left can be allowed up to 10% so that the ratio $C_1/C_D$ may be sufficient if it is about 1/80 or more. As a matter of fact, because of $\alpha=80$ to 100 mV/decade (at room temperature), the ratio $C_1/C_D$ is desired to be a little higher.

Figure 22:
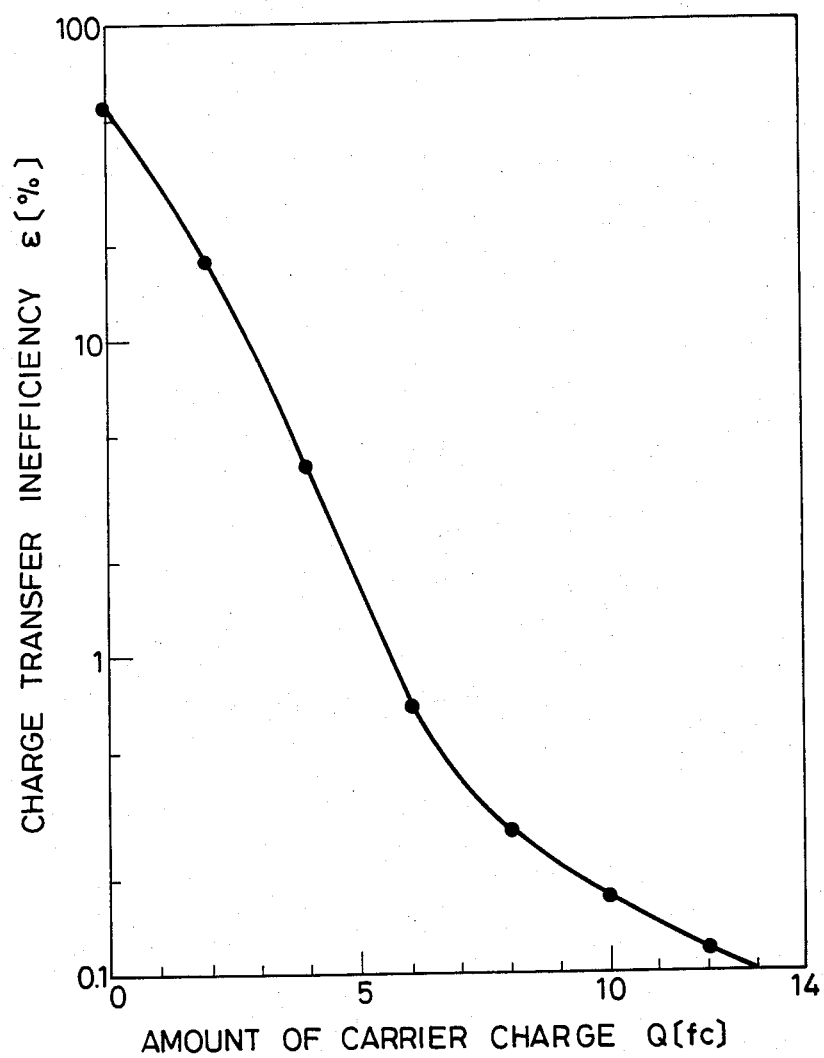
FIG. 22 is a graph showing the relationship between the charge transfer efficiency and the quantity of the carrier charges.

Next, FIG. 22 quantitively shows the effect of the carrier charges. There is shown the ratio of the quantity of the signal charges left beneath the driving gate transistors to the quantity Q of the carrier charges. Incidentally, the quantity of the signal charges is 6 fc. By supplying the data lines with the carrier charges in substantially the same quantity as that of the signal charges, as seen from FIG. 22, the charges to be left can be remarkably reduced so that the signal charges can be transferred substantially completely. As the capacitance of the capacitor to be used in the carrier charge supplying means, a value 50 to 100 fF similar to that of the memory cell is sufficient so that the ratio of the charge supplying means to the whole memory may be about 0.1%.

Here, from the two foregoing embodiments, it has been apparent that the present invention can provide a semiconductor storage device which can efficiently detect the signal charges at a low level. Next, the present invention will be further described in connection with another embodiment in which it is applied to a memory using multiple level storage structure by making use of that performance.

The multi-level storage structure memory stores information of three values or more in a 1Tr-1C memory cell used in the DRAM and is a method which is very effective for high integration of the memory. We, the Inventors, have already proposed a system in which a multi-level step voltage is applied to the word lines or plates (as is disposed in Japanese Patent Applications Nos. 58-120364 and 58-242021). In case n values are to be stored in that memory, the quantity of the signal charges to be sensed is reduced to a 1/(n−1) as high as that of the DRAM. In the case of n=16, for example, the signal voltage to appear on the data lines is about 10 to 20 mV, which is below the sensitivity of a sense amplifier used generally in the DRAM, so that a stable operation cannot be expected. According to the present invention, however, not only the case of n=16 but also the case of n=32 can be effected. The operations will be described in the following with reference to FIGS. 23 and 24.

Figure 23:
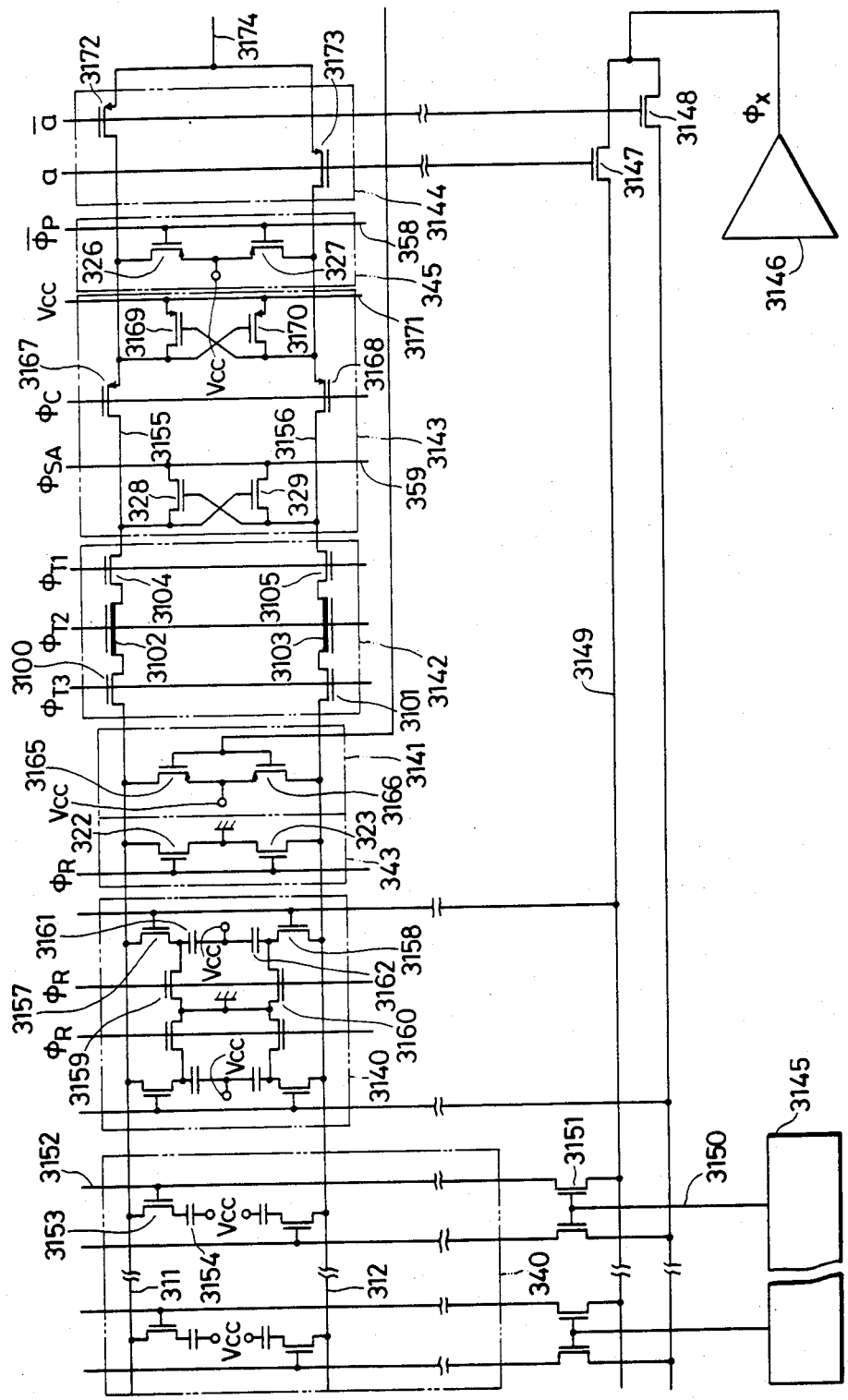
FIGS. 23 and 24A to 24J are a circuit diagram and its operation timing chart showing still another embodiment in which the present invention is applied to the reading-out means of the semiconductor memory using the multi-level storage structure.

FIG. 23 shows one example of the structure of a semiconductor memory using multiple level storage structure. In FIG. 23, reference numeral 340 indicates a memory array; numeral 3140 means for supplying the carrier charges and the reference charges (i.e., the dummy charges); numeral 343 a reset gate transistor; numeral 3141 means for writing; numeral 3142 means for charge transfer; numeral 3143 information sensen amplifier; numeral 345 a precharge gate transistor; and numeral 3144 a select circuit for selectively outputting the sense information of either of the paired data lines. Although only one pair of the data lines is shown, a plurality of pairs of data lines are in fact arranged to intersect the plural word lines at a right angle.

If, now, a signal a for selecting one of the paired data lines is at a high voltage (e.g., $V_{CC}$), the multi-level step waves generated by a multi-level step voltage generating circuit 3146 are transmitted to a signal line 3149 through a transistor 3147 in its conducting stage. On the other hand, the selection of the word lines is conducted by an X-decoder 3145. More specifically, only one (e.g., 3150 in this case) of the plural output lines of the X-decoder is set at a high voltage (e.g., $V_{CC}$). Then, a transistor 3151 is rendered conducting so that the multi-level step waves are outputted from the signal line 3149 to a word line 3152. As a result, the signal is outputted to the data line from the memory cell connected with that word line. In the example of FIG. 23, the signal charges are outputted from the data line 311 from the memory cell which is composed of a transistor 3153 and a capacitor 3154. Since the amplitude of the multi-level step waves is 200 mV and since the memory cell capacitance is 50 $f_F$, the quantity of the signal charges is about 10 fC. On the other hand, those multi-level step waves are also applied to the carrier charge supplying means 3140. In this example, the multi-level step waves are applied to the gates of transistors 3157 and 3158 so that the (carrier charges) and the (carrier charges+reference charges) are outputted to the data lines 311 and 312, respectively, each time and in synchronism with the change in the multi-level step voltage. The quantity of the carrier charges is also at a value similar to that of the signal charges, i.e., about 10 fC. The signal charges, the reference charges and the carrier charges, which are outputted to the data lines, are transferred by the charge transfer means 3142 to output nodes 3155 and 3156 of the charge transfer means so that the relationships in the quantities among those charges are sensed by the information sense amplifier. More specifically, in the case (i) of the quantity of the signal charges<the quantity of the reference charges, the output node 3155 is at the higher level (e.g., the supply voltage $V_{CC}$) whereas the output node 3156 is at the lower level (e.g., the earth potential $V_{SS}$). In the case (ii) of the quantity of the signal charges>the quantity of the reference charges, on the contrary, the output node 3155 is at the lower level, whereas the output note 3156 is at the higher level. In either case, the sensing operation is conducted. While the voltage to be applied to the memory cell is low, no signal charge is outputted to hold the state (i). As that voltage rises, the (word line voltage)>the (storage voltage of the memory cell)+the (gate threshold voltage of the memory cell transistor 3153). Then, the signal charges are outputted to the data lines to invite the state (ii) so that the relationship in the levels between the potentials at the output nodes 3155 and 3156 of the charge transfer means is inverted. Thus, the information (i.e., the storage level), which is stored in the memory cell, can be read out as the timing at which the relationship in the levels between the potentials at the output nodes of the charge transfer means invert.

Figure 24:
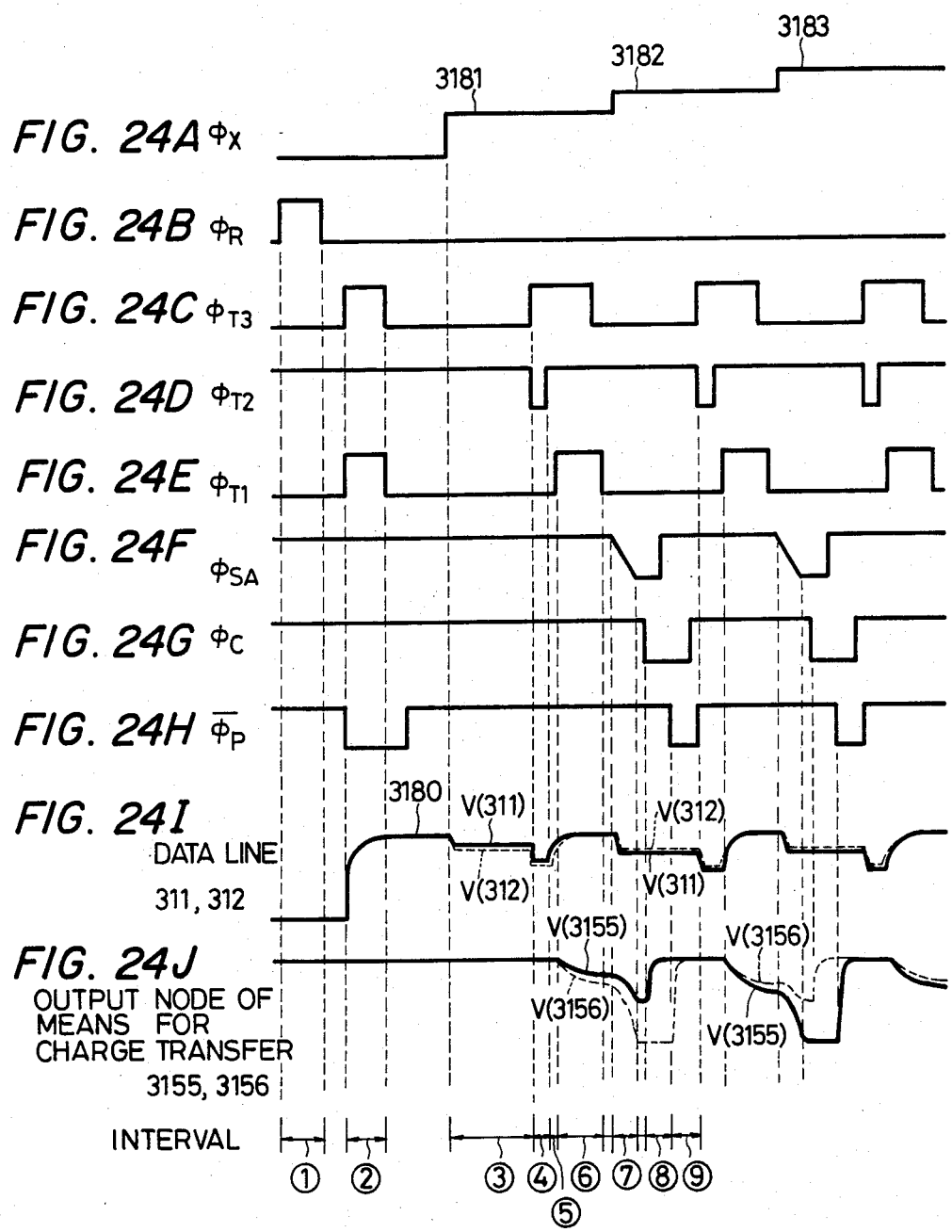

FIG. 24 is a timing chart showing the operations in more detail.

For period 1: The reset pulses $\phi_R$ are applied to set the data lines at $V_{SS}$ and the potential of one node of a charge supplying capacitor 3161 or 3162 at $V_{SS}$.

For period 2: Simultaneously as the precharge pulses $\phi_P$ are applied, the pulses $\phi_{T3}$ and $\phi_{T1}$ are applied to render the charge transfer gate transistors T3 and T1 conducting to precharge the data lines. At this time, in order to realize the potential state shown in FIG. 21(b), a difference is made between the threshold voltages of the transistors T3 and T1 or between the pulse heights of the pulses $\phi_{T3}$ and $\phi_{T1}$. Moreover, the potential at the data lines is set at the (height of the pulses $\phi_{T3}$)−the (threshold voltage of the transistor T3).

For period 3: Simultaneously as multi-level step waves $\phi_X$ are applied to the word lines, the carrier charges and the referece charges are outputted to the data lines. Since, in this embodiment, the word line potential fails to exceed the (storage voltage of the capacitor 3154)+the (threshold voltage of the transistor 3153), no signal voltage is outputted to the data lines. As a result, the potential V(311) of the data line 311 is higher than the potential V(312) of the data line 312.

For period 4: Pulses $\phi_{T3}$ and $\phi_{T2}$ are applied, and the bias charges for accelerating the charge transfer are injected from the drive gate transistor to the data lines.

For periods 5 and 6: The pulses $\phi_{T2}$ are returned to the high potential (e.g., $V_{CC}$), and the pulses $\phi_{T1}$ are applied to effect the transfer of the charges. For these periods, most of the signal charges, the carrier charges and the reference charges are transferred to the output nodes 3155 and 3156 of the charge transfer means. This voltage difference of V(3155)−V(3156) is amplified by $\alpha$ times ($\alpha \simeq$ the data line capacitance/the capacitance at the output node of the charge transfer means) of the data line voltage difference of V(3111)−V(3112). The value $\alpha$ generally has about 10 to 20.

For period 7: The difference between the voltages at the output nodes 3155 and 3156 is further amplified by an N-type MOS flip-flop sense amplifier (which is composed of the transistors 328 and 329).

For period 8: pulses $\phi_C$ are applied to render transistors 3167 and 3168 conducting so that the high level is clamped at the high potential (e.g., the supply voltage $V_{CC}$) by a P-type MOS flip-flip amplifier.

For period 9: The precharge pulses $\phi_P$ are applied to set the output nodes 3155 and 3156 at the high level (e.g., $V_{CC}$) so that preparation may be made for the subsequent reading-out.

In the semiconductor memory using the multi-level storage structure, this cycle is repeated by (n−1) times (wherein n: the number of levels to be stored) so that the timing at which the signal flows out from the memory cell to the data lines is detected. In this example, the signal charges are outputted by the second reading-out to the data lines so that the potential at the data line 311 becomes lower than that at the data line 312. As a result, the relationship between the potentials at the output nodes of the charge transfer means is inverted (to V(3155)<V(3156) from that of the foregoing case (V(3155)>V(3156)).

As has been described in the present example, means for transferring the signal charges without any loss is indispensable in case it is necessary to read out especially small signal charges, as in the reading-out means of the semiconductor memory using the multi-level storage structure. The charge supplying means according to the present invention can reduce the ratio of its area to the memory array and can remarkably improve the transfer efficiency.

Figure 25:
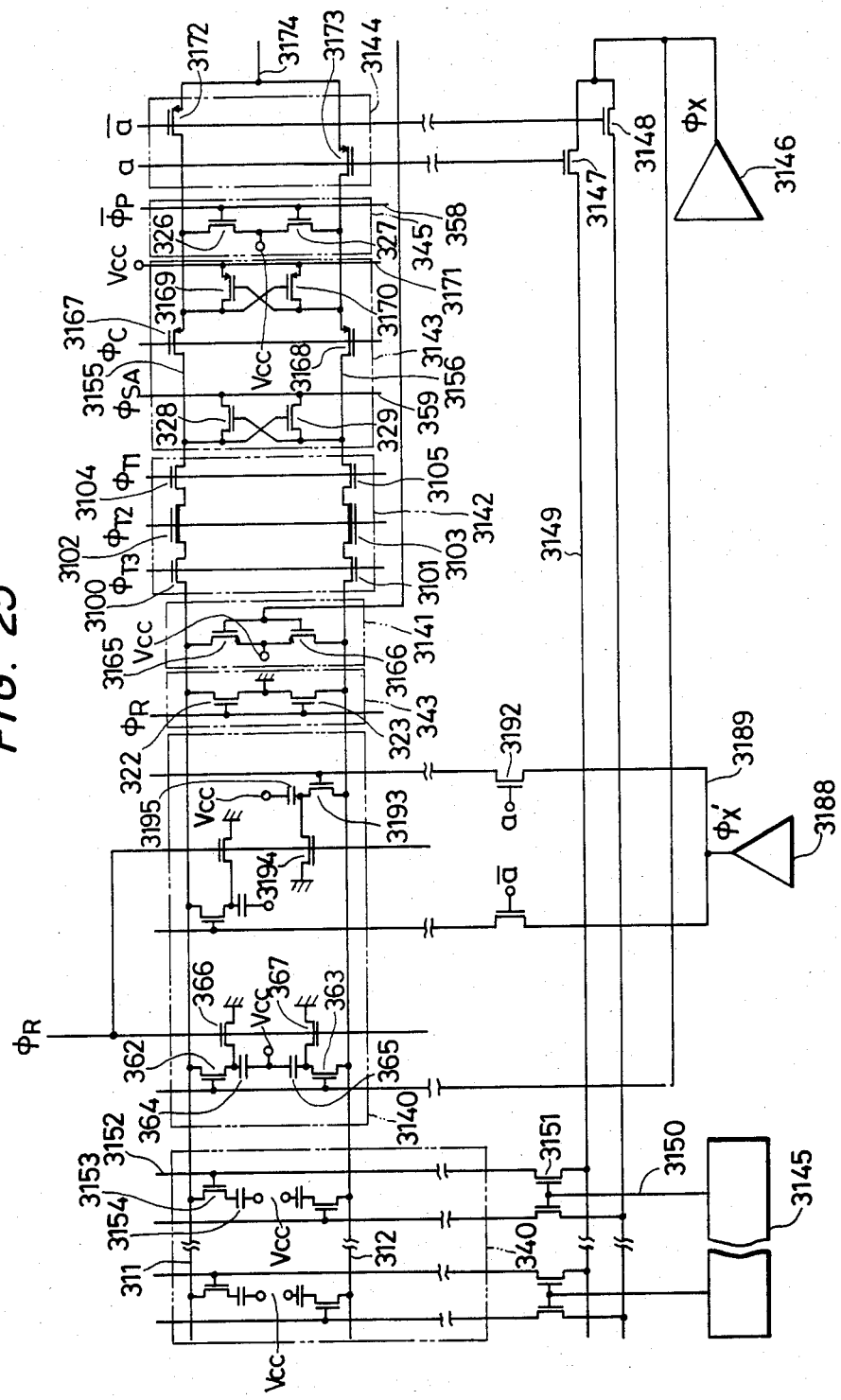
FIG. 25 is a circuit diagram showing a further embodiment of the construction of the charge supply means.

FIG. 25 shows another example exemplifying the charge supplying means used in FIG. 23. In this example, the drive of the carrier charge supplying means is conducted by applying the same multi-level step waves $\phi_X$ as those applied to the word lines and by applying other multi-level step waves $\phi_X'$ having a different amplitude to the reference charge supplying means from another means 3188 for generating other multi-level step waves. The quantity of the reference charges is desired to be one half as much as that of the signal charges to be outputted from the memory cell. One means for realizing this is a method by which the amplitudes of the driving pulses (i.e., the multi-level step waves) are made equal so that the capacitance for supplying the reference charges is made one half as much as the memory cell capacitance. If, however, the area of the memory cell is reduced in accordance with increase in the capacity of the memory, it is not easy to accurately reduce the capacitance to one half, and it is necessary to determine the capacitance by the try-and-error method especially in the case of the memory cell having a stereoscopic structure so that it is complicated. In order to obviate these difficulties, in this example, the capacitance for the reference charge supply is made identical to that of the memory cell capacitance, whereas the amplitude of the multi-level step waves is differentiated. (More specifically, the voltage step of the pulses $\phi_X'$ is reduced to one half of the voltage step of the pulses $\phi_X$.).

As has been described hereinbefore, according to the present invention, the high-sensitivity means for reading out, which forms an especially important element in the large-capacity memory, is realized by: the charge transfer means disposed at each data line; the charge supply means for supplying the charges to the data lines prior to the reading-out operation; and the means disposed at the output nodes of the charge transfer means for sensing the magnitudes of the charges to be transferred to those output nodes. According to the present invention, the circuit scale can be made small, and the sensitivity can be improved by one order or more. Thus, it is possible to easily realize a memory of very high integration density such as the semiconductor memory using the multi-level storage structure.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor device comprising a memory array which includes a plurality of memory cells storing charge carriers as information data, address means for selecting at least one of the memory cells, data lines which are coupled to the memory cells to transfer the charge carriers as the information data therethrough, means for writing the information data into the memory cells coupled to said data lines, and means for reading out the information data from the memory cells coupled to said data lines; said reading-out means being comprised of a reset gate transistor coupled to said data line, a charge transfer portion coupled to said data lines, a precharge gate transistor at an output end of said charge transfer portion, and a sense amplifier coupled to said output end; said charge transfer portion including at least two charge transfer gates and a driving gate disposed between the two charge transfer gates; wherein a terminal of said reset gate transistor is coupled to means for applying a voltage which is lower when electrons are used as the charge carriers or higher when holes are used as the charge carriers, than a magnitude obtained by subtracting a threshold voltage of the charge transfer gate on a data line side of said charge transfer gates from a highest value of a voltage that is applied to said charge transfer gate on a data line side.

2. A semiconductor device according to claim 1, wherein said sense amplifier is an amplifier which detects a voltage.

3. A semiconductor device according to claim 1, wherein a capacitance $C_I$ of an input end of said sense amplifier is related to a capacitance $C_D$ of said data line and a capacitance $C_1$ of the charge driving gate as follows:

$$C_D > C_1 \geq C_I.$$

4. A semiconductor device comprising a memory array which includes a plurality of memory cells storing charge carriers as information data, address means for selecting at least one of the memory cells, data lines which are coupled to the memory cells to transfer the charge carriers as the information data therethrough, means for writing the information data into the memory cells coupled to said data lines, and means for reading out the information data from the memory cells coupled to said data lines; said reading-out means being comprised of a reset gate transistor coupled to said data lines, a charge transfer portion coupled to said data lines, a precharge gate transistor at an output end of said charge transfer portion, and a sense amplifier coupled to said output end; said charge transfer portion including at least two charge transfer gates and a driving gate disposed between the two charge transfer gates; wherein letting $V_{ThT1}$ denote a threshold voltage of a first charge transfer gate on the data line side of said charge transfer gates, $V_{ThT2}$ denotes a threshold voltage of said driving gate and $V_{ThT3}$ denotes a threshold voltage of a second charge transfer gate on the sense amplifier side of said charge transfer gates, the threshold voltage of said respective gates are selected to establish the relationship of:

$$V_{ThT1} > V_{ThT3} > V_{ThT2} \tag{1a}$$

when electrons are used as the charge carriers, or to establish the relationship of:

$$V_{ThT1} < V_{ThT3} < V_{ThT2} \tag{1b}$$

when holes are used as the charge carriers.

5. A semiconductor device according to claim 4, wherein said driving gate is of a depletion type.

6. A semiconductor device according to claim 4, wherein $V_{\phi H}$ denotes a high level of a pulse which is impressed on said charge transfer portion, $V_{\phi L}$ denotes a low level of said pulse, and the threshold voltages of said respective gates on which said pulse is impressed are selected to establish the relationship of:

$$V_{\phi H} - V_{ThT1} > V_{\phi L} - V_{ThT3} \tag{2a}$$

in the case of transferring the electrons as the charge carriers, or to establish the relationship of:

$$V_{\phi L} - V_{ThT1} < V_{\phi H} - V_{ThT3} \quad (2b)$$

in the case of transferring the holes as the charge carriers.

7. A semiconductor memory comprising:
a memory cell and a dummy cell each coupled to a pair of data lines, said memory cell and said dummy cell each including means for storing respective signal charges as information data, the amount of the signal charges in said memory cell being different than that of said dummy cell;
a word line coupled to the memory cell and a dummy word line coupled to the dummy cell;
read-out means coupled to said word line and said dummy word line to couple the signal charges of said memory cell to one of said pair of data lines and to couple the signal charges of said dummy cell to the other of said pair of data lines for a read-out operation;
a sense amplifier coupled to both of said data lines to amplify voltage differences between said data lines;
charge supply means and charge transfer means coupled to both of said data lines between said sense amplifier and said memory cell and dummy cell;
means for driving said charge transfer means to transfer signal charges on said data lines from said memory cell and said dummy cell to said sense amplifier; and
means for driving the charge supply means to provide equal quantities of carrier charges to both of said data lines prior to transfer of said signal charges to accelerate the transfer of said signal charges to said sense amplifier.

8. A semiconductor memory according to claim 7, wherein said charge supply means comprises a pair of capacitors coupled in series between said data lines and a driving line coupled to said means for driving said charge supply means, said driving line being coupled to a junction between said pair of capacitors.

9. A semiconductor memory according to claim 8, wherein said charge transfer means comprises a first charge transfer gate coupled to one of said data lines and a second charge transfer gate coupled to the other of said data lines for controlling the passage of said signal charges to said sense amplifier.

10. A semiconductor memory according to claim 8, wherein said pair of capacitors comprises first and second MOS transistors, said first MOS transistor having its gate coupled to one of said data lines, said second MOS transistor having its gate coupled to the other of said data lines, and both of said MOS transistors having their sources and drains shorted together and coupled to the source and drain of the other MOS transistor.

11. A semiconductor memory according to claim 7, wherein said charge transfer means comprises a first charge transfer gate coupled to one of said data lines and a second charge transfer gate coupled to the other of said data lines for controlling the passage of said signal charges to said sense amplifier.

12. A semiconductor memory according to claim 7, further comprising a reset gate circuit coupled to said data lines between said memory cell and dummy cell and said charge transfer means and a precharge circuit coupled to said data lines between said charge transfer means and said sense amplifier.

13. A semiconductor memory according to claim 7, wherein said charge transfer means is comprised of first and second charge gates coupled along one of said data lines with a driving gate disposed between said first and second charge gates and third and fourth charge gates coupled along the other of said data lines with a driving gate disposed between said third and fourth charge gates.

14. A semiconductor memory according to claim 7, wherein said charge supply means is constructed to have the same circuit arrangement as said dummy cell.

15. A semiconductor memory according to claim 7, wherein said charge supply means includes:
a first capacitor coupled to a supply voltage and to a first one of said pair of data lines by a first charge transfer transistor;
a second capacitor coupled to said supply voltage and coupled to the other of said pair of data lines by a second charge transfer transistor;
a first capacitor potential reset transistor coupled to the first capacitor; and
a second capacitor potential reset transistor coupled to said second capacitor.

16. A semiconductor memory according to claim 15, wherein said dummy cell has the same circuit arrangement as said charge supply means.

17. A semiconductor memory according to claim 15, wherein said charge supply means includes a pair of said first capacitors coupled to said one of said data lines by respective ones of a pair of first charge transfer transistors and further coupled to respective ones of a pair of first capacitor potential reset transistors, and wherein said charge supply means further includes a pair of second capacitors coupled to the other of said pair of data lines by respective ones of a pair of second charge transfer transistors and further coupled to respective ones of a pair of second capacitor potential reset transistors.

18. A semiconductor memory according to claim 15, wherein said first capacitor potential reset transistor is an IGFET coupled to have a source-drain path between the first capacitor and a ground potential and to have a gate coupled to receive a reset signal, and wherein said second capacitor potential reset transistor is an IGFET coupled to have a source-drain path between the second capacitor and the ground potential and to have a gate coupled to receive said reset signal.

19. A semiconductor device comprising a memory array which includes a plurality of memory cells to store signal charges as information data, address means for selecting the respective memory cells, data lines which are coupled to the memory cells to transfer the signal charges therethrough, means for writing information into the memory cells and means for reading information from the memory cells, wherein said reading means for each of said memory cells comprises:
a charge supply circuit coupled to a data line at the output of said memory cell;
a charge transfer circuit coupled to the data line at the output of the charge supply circuit;
a sense amplifier coupled to the data line at the output of the charge transfer circuit;
means for driving the charge transfer circuit to transfer siganl charges on said data line from the memory cell to the sense amplifier; and
means for driving the charge supply circuit to provide a quantity of charges to said data line prior to transfer of the signal charges to accelerate the transfer of the signal charges to said sense amplifier.

20. A semiconductor device according to claim 19, wherein said charge transfer circuit comprises a pair of charge gates coupled along said data line with a driving gate coupled between said charge gates.

21. A semiconductor device according to claim 19, wherein a pair of data lines are coupled between said memory cell and said sense amplifier with the charge supply circuit and the charge transfer circuit being coupled to both of said data lines.

22. A semiconductor device according to claim 21, wherein said charge supply circuit comprises first and second capacitors coupled in series between said pair of data lines, said first and second capacitors being coupled to a first control line at a junction between the first and second capacitors, and third and fourth capacitors coupled in series between said pair of data lines, said third and fourth capacitors being coupled to a second control line at a junction between said third and fourth capacitors.

23. A semiconductor device according to claim 22, wherein said charge transfer circuit is comprised of first and second charge gates coupled along one of said data lines with a driving gate disposed between said first and second charge gates and third and fourth charge gates coupled along the other of said data lines with a driving gate disposed between said third and fourth charge gates.

24. A semiconductor device according to claim 23, further comprising a reset gate circuit coupled to said data lines between said charge supply means and said charge transfer means and a precharge circuit coupled to said data lines between said charge transfer means and said sense amplifier.

25. A semiconductor device according to claim 19, further comprising a reset gate circuit coupled to said data line between said memory cell and said charge transfer circuit, and a precharge circuit coupled to said data line between said charge transfer circuit and said sense amplifier.

26. A semiconductor memory according to claim 19, wherein said charge supply means includes a first capacitor coupled to a supply voltage and coupled to said data line by a first charge transfer transistor, and wherein said charge supply means further includes a first capacitor potential reset transistor coupled to said first capacitor.

27. A semiconductor memory according to claim 26, wherein said first capacitor potential reset transistor is an IGFET having a source-drain path coupled between said first capacitor and ground potential and having a gate coupled to receive a reset signal.

28. A semiconductor memory comprising:
a memory cell coupled to a data line, said memory cell including storing means for signal charges;
a word line coupled to the memory cell;
address means coupled to said word line to couple said storing means of the memory cell to said data line;
a sense amplifier coupled to said data line;
charge supply means and charge transfer means provided between said sense amplifier and said memory cell;
means for driving said charge transfer means to transfer signal charges on said data line from said memory cell to said sense amplifier; and
means for driving said charge supply means to provide a quantity of charges to said data line prior to transfer of the signal charges to said sense amplifier.

29. A semiconductor memory according to claim 28, wherein said charge supply means comprises a capacitor coupled to said data line and a driving line coupled to said means for driving said charge supply means, said driving line being coupled to said capacitor.

30. A semiconductor memory according to claim 29, wherein said charge transfer means comprises a pair of charge transfer gates coupled along said data line for controlling the passage of said signal charges to said sense amplifier.

31. A semiconductor memory according to claim 28, wherein said charge transfer means comprises a pair of charge transfer gates coupled along said data line for controlling the passage of said signal charges to said sense amplifier.

32. A semiconductor memory according to claim 28, wherein said capacitor comprises a first MOS transistor, said first MOS transistor having its gate coupled to said data line and its source and drain shorted together.

33. A semiconductor memory according to claim 28, further comprising a reset gate circuit coupled to said data line, wherein said charge transfer means and a precharge circuit are coupled to said data line between said charge transfer means and said sense amplifier.

* * * * *